(12) United States Patent
Fukuda et al.

(10) Patent No.: US 8,493,103 B2
(45) Date of Patent: Jul. 23, 2013

(54) OUTPUT DRIVER CIRCUIT

(75) Inventors: Koji Fukuda, Fuchu (JP); Hiroki Yamashita, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 168 days.

(21) Appl. No.: 12/987,092

(22) Filed: Jan. 8, 2011

(65) Prior Publication Data

US 2011/0193595 A1    Aug. 11, 2011

(30) Foreign Application Priority Data

Feb. 5, 2010   (JP) .................................. 2010-023970

(51) Int. Cl.
*H03B 1/00* (2006.01)
*H03K 3/00* (2006.01)

(52) U.S. Cl.
USPC ............... 327/112; 327/108; 323/83; 323/86

(58) Field of Classification Search
USPC ................. 327/148, 157, 534–537, 108–112, 327/379, 389, 391; 363/59, 60; 326/22–27, 326/81–87
See application file for complete search history.

(56) References Cited

U.S. PATENT DOCUMENTS

| | | | | |
|---|---|---|---|---|
| 5,949,253 A * | 9/1999 | Bridgewater, Jr. | ............... | 326/86 |
| 6,222,388 B1 * | 4/2001 | Bridgewater, Jr. | ............... | 326/86 |
| 6,624,670 B2 * | 9/2003 | Payne et al. | .................... | 327/108 |
| 2008/0246511 A1 * | 10/2008 | Miura et al. | .................... | 326/83 |
| 2010/0231268 A1 * | 9/2010 | Kumar et al. | ................. | 327/108 |

FOREIGN PATENT DOCUMENTS

JP    2005-223872 A    8/2005

* cited by examiner

*Primary Examiner* — Lincoln Donovan
*Assistant Examiner* — Brandon S Cole
(74) *Attorney, Agent, or Firm* — Miles & Stockbridge P.C.

(57) ABSTRACT

Disclosed is an output driver circuit capable of realizing reduction in power consumption, and/or enhancement in transmission waveform quality in addition to an increase in transmission speed. The output driver circuit is provided with, for example, a voltage-signal generation circuit block VSG_BK for driving positive negative output-nodes (TXP, TXN) by voltage, -pulse-signal generation circuits PGEN1, PGEN 2 for generating a pulse signal upon a transition of data input signals DIN_P, DIN_N, and current-signal generation circuit blocks ISG_BKp1, ISG_BKn1, for driving TXP, TXN by current for the duration of a pulse width of the pulse-signal. The current-signal generation circuit block executes high-speed charging of parasitic capacitors Cp1, Cp2, occurring to TXP, TXN, respectively, while executing charging of parasitic capacitors Cp1, Cp2, occurring to impedance Z0 respectively. VSG_BK decides a voltage level at TXP, TXN, in the stationary state, keeping TXP, TXN as terminal nodes at impedance Z0, respectively.

2 Claims, 16 Drawing Sheets

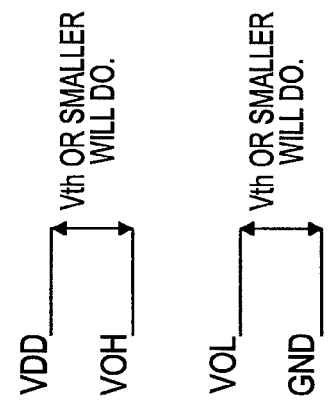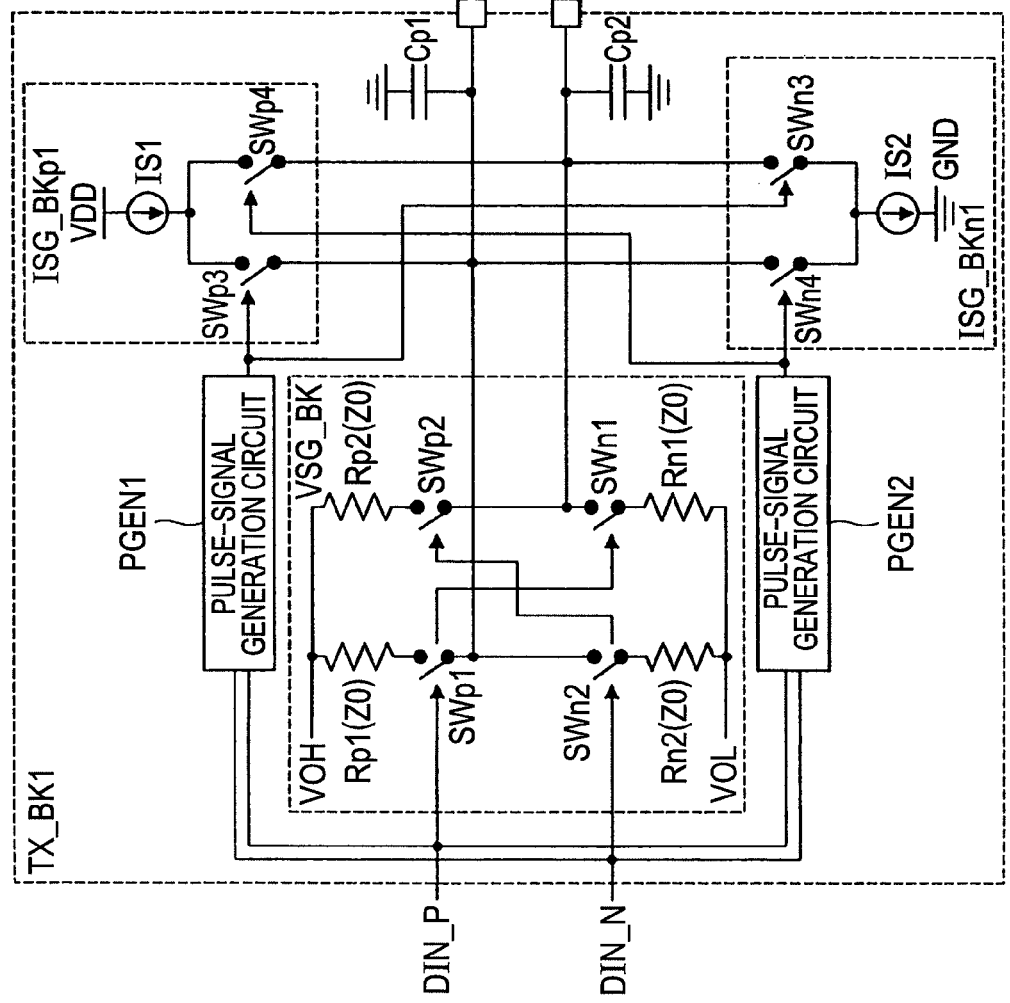

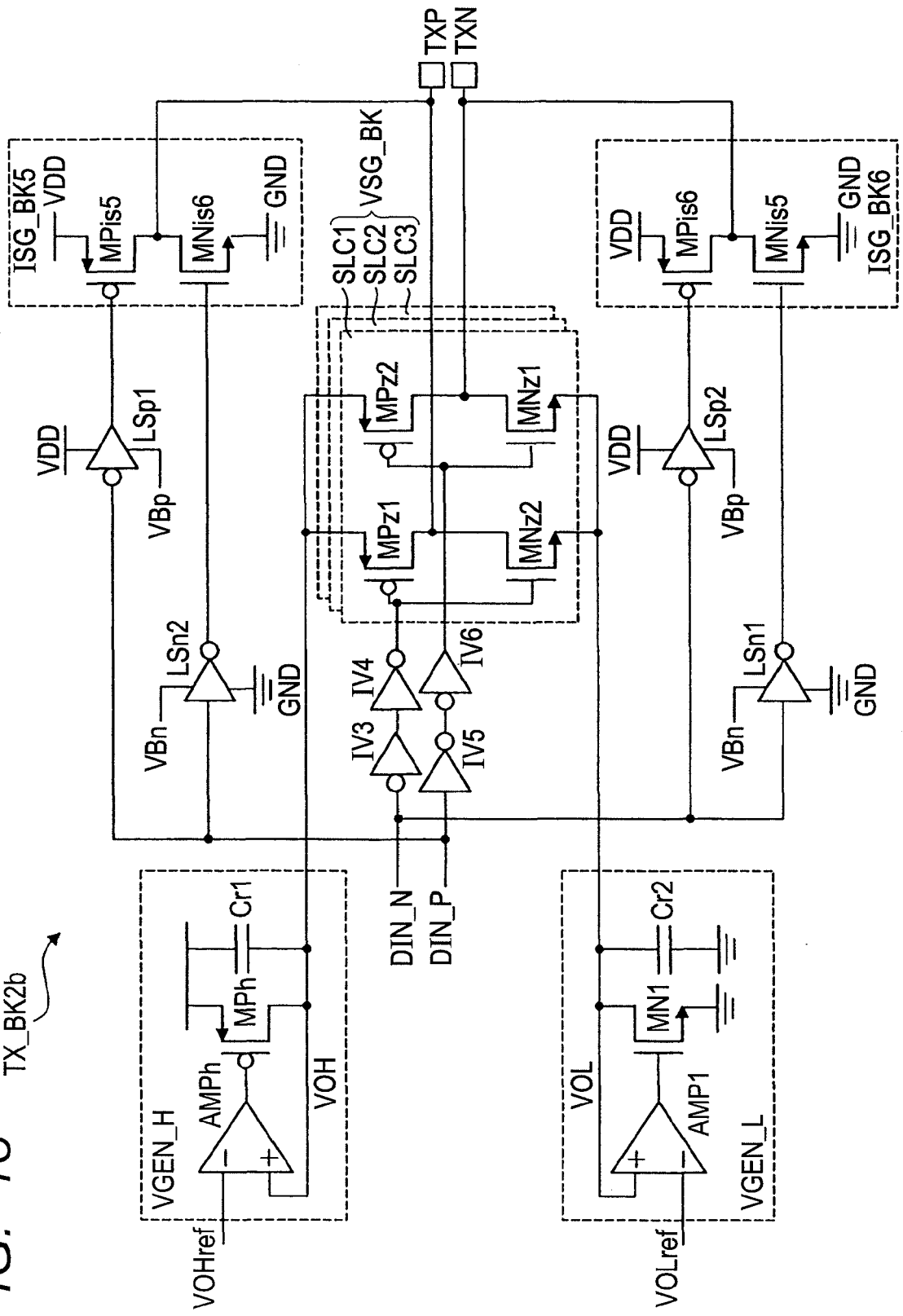
FIG. 13 TX_BK2b

OUTPUT DRIVER CIRCUIT

CLAIM OF PRIORITY

The present application claims priority from Japanese patent application JP 2010-023970 filed on Feb. 5, 2010, the content of which is hereby incorporated by reference into this application.

FIELD OF THE INVENTION

The present invention relates to an output driver circuit, and in particular, to a technology effective for application to the output driver circuit of an optical communication system representative of high-speed communications.

BACKGROUND OF THE INVENTION

For example, in FIG. 6 referred to in JP-A-2005-223872, there is shown a differential drive circuit wherein a driver circuit, and an emphasizer are connected to common differential output terminals. The driver circuit is made up of a bridge circuit comprised of four units of MOS transistors, and a power source voltage thereof is supplied via a source follower circuit. The emphasizer as well is made up of a bridge circuit comprised of four units of MOS transistors, and a power source current thereof is supplied by a constant current source.

SUMMARY OF THE INVENTION

As a result of a higher transmission speed lately achieved, the transmission speed of an optical communication system has made a transition to, for example, 10 Gbps to 25 Gbps, 40 Gbps, and so forth. In such a high-speed communications sector, a higher-speed is naturally required of a circuit, and it is desirable to realize reduction in power consumption, enhancement in transmission waveform quality, and so forth, together with the higher-speed. Accordingly, studies have been made on those aspects.

FIGS. 15A, 15B each are a circuit diagram showing a configuration example of an output driver circuit studied as a prerequisite for the invention. An output driver circuit shown in FIG. 15A is a so-called CML (Current Mode Logic) differential amplifier DAMP. DAMP is provided with external load resistances, each having impedance at Z0, the DAMP driving the external load resistances having impedance at 2×Z0. An output driver circuit shown in FIG. 15B is an example of a configuration of the output driver circuit of FIG. 15A, provided with a pre-emphasis circuit (signal equalization circuit) EMP comprising differential pair of transistors sharing differential output nodes.

Herein, if, for example, a data input signal DIN [n] of the present cycle [n] is inputted to one of differential inputs of the DAMP, and an inversion data input signal /DIN [n−1] of a preceding cycle [n−1] is inputted to one of differential inputs of EMP, this will enable a data output signal to be generated by taking intersymbol interference from the preceding cycle into account during the present cycle.

Use of the configuration examples shown in FIGS. 15A, 15B, respectively, will enable high-speed operation following operation in current mode. Further, impedance matching, and waveform equalization can be easily effected, so that it is possible to achieve, enhancement in transmission waveform quality. However, when a tail current of, for example, 4×I0 is caused to flow to the DAMP, current at only I0, that is, only ¼ of the tail current flows to the external load resistances, so that power consumption will be very large.

FIGS. 16A, 16B each are a circuit diagram showing another configuration example of the output driver circuit studied as the prerequisite for the invention. The output driver circuit shown in FIG. 16A is provided with a plurality (in this case, 2 units) of slicing circuits SLC1, SLC2, the slicing circuits each comprising 2 units of driver circuits DV1, Dv2, the driver circuits each being of a CMOS inverter configuration. In the respective slicing circuits, an output of DV1 is connected to one end of a common external load resistance having impedance 2×Z0 while an output of DV2 is connected to the other end of the common external load resistance having impedance 2×Z0. For example, when a positive data input signal DIN_P is inputted to DV1, and inputted to DV2, the external load resistance is driven via a path of a PMOS transistor MPz11 of DV1, and an NMOS transistor MNz22 of DV2, or via a path of a PMOS transistor MPz21 of DV2, and an NMOS transistor MNz12 of DV1.

Now, upon driving the external load resistance, there is the need for setting impedance on the PMOS transistor side and impedance on the NMOS transistor side to Z0, respectively, in order to attain impedance matching. The slicing circuits SLC1, SLC2 represent a configuration for meeting the need. More specifically, the slicing circuits each can be set as either valid or invalid (not shown), and if the slicing circuit is set as invalid, the respective MOS transistors, making up the respective driver circuits DV1, Dv2, are fixed in the OFF state. Accordingly, impedance can be adjusted by deciding on how many units of the slicing circuits are set as valid, so that the impedance can be set to Z0 even in the case of occurrence of, for example, manufacturing variations, and so forth, thereby achieving enhancement in transmission waveform quality. Furthermore, if use is made of the configuration example described as above, a power supply current in whole is supplied to the external load resistance, so that power consumption can be reduced. However, with the configuration example described as above, a voltage-mode operation is executed, and therefore, there exists a risk that higher speed cannot be attained.

The output driver circuit shown in FIG. 16B represents the configuration example of the output driver circuit, wherein a function of the waveform equalization as previously described is added to, for example, the driver circuit DV1 of FIG. 16A. More specifically, it is a configuration example of the output driver circuit comprising a driver circuit DVp1 to which a positive data input signal DIN_P [n] in the present cycle [n] is inputted, and a driver circuit DVp2 to which a negative data input signal DIN_N [n−1] in a preceding cycle [n−1] is inputted, the driver circuit DVp2 being added to the driver circuit DVp1 in such a way as to share an output. Respective MOS transistors, making up the driver circuit DVp1, are set to a size (W) larger than a size (W) for respective MOS transistors, making up the driver circuit DVp2.

With the configuration example, since the waveform equalization can be effected with DVp2 functioning as the pre-emphasis circuit as shown in FIG. 15B, enhancement in the transmission waveform quality can be achieved. However, in this case, there is the need for impedance matching, including impedance of the pre-emphasis circuit (DVp2). For example, in the case where a PMOS transistor of DVp1, and an NMOS transistor of DVp2 are turned ON according to a data pattern, it is necessary to set the slicing circuit either valid or invalid such that resistance in parallel with ON resistance Rp of the PMOS transistor, and ON resistance Rn of the NMOS transistor will be equal to the impedance Z0.

Accordingly, impedance adjustment is rendered somewhat complicated. Further, addition of the pre-emphasis circuit will cause a penetration current from, for example, DVp1 toward DVp2 to occur, so that power consumption will increase.

Thus, it is not easy to realize reduction in power consumption, and enhancement in transmission waveform quality in addition to higher working speed of the circuit. Accordingly, use of the configuration described in JP-A-2005-223872 is conceivable. In the case of the configuration shown in JP-A-2005-223872, waveform equalization is performed by use of current drive by an emphasis signal (EMP+), in combination with use of voltage drive by an input signal (IN+) for every data cycle, as shown in FIGS. 7 to 9. However, with the use of a technology according to JP-A-2005-223872, it is not always possible to satisfactorily effect enhancement in the transmission waveform quality. In order to improve the transmission waveform quality (that is, to expand the eye of a so-called eye pattern), it is desirable to adopt a circuit configuration whereby an optimum amount of waveform equalization, and an optimum signal amplitude can be set according to communication system conditions, however, the technology according to JP-A-2005-223872 is unable to cope with those requirements.

Furthermore, there is the risk that the technology according to JP-A-2005-223872 is unable to satisfactorily cope with a need for a still higher working speed owing to a circuit configuration in some cases.

The invention has been developed under circumstances described as above, and it is an object of the invention to provide an output driver circuit capable of realizing not only an increase in communication speed but also reduction in power consumption, and/or enhancement in transmission waveform quality. The above and other objects, features and advantages of the present invention will be apparent from the following detailed description of the present specification in conjunction with accompanying drawings.

Now, representative embodiments of the invention disclosed under the present application will be briefly described hereinafter.

A first output driver circuit according to one aspect of the invention is provided with a voltage-signal generation circuit block for driving a differential output node by voltage according to the logical level of a differential input node, a pulse-signal generation circuit for generating a one-shot pulse-signal upon transition of the logical level of the differential input node, and a first current-signal generation circuit block for driving the differential output node by current for the duration of a pulse width of the one-shot pulse-signal. The voltage-signal generation circuit block executes voltage-driving against positive and negative differential output nodes, respectively, at first impedance.

With the use of such a configuration as described, when the signal of the differential output node is caused to make a transition, current-driving is executed by the first current-signal generation circuit block, so that high-speed signal transition is enabled. Thereafter, with the elapse of a pulse period of the one-shot pulse-signal, a voltage signal level at the differential output node, in the stationary state, is decided by the voltage-signal generation circuit block. For the duration of transition of the signal, and during the stationary state of the signal, the voltage-signal generation circuit block functions as a circuit for impedance matching. By so doing enhancement in transmission waveform quality can be realized. Further, if the pulse period of the one-shot pulse-signal is set as appropriate according to a communication system in use, this will enable proper pre-emphasis, thereby realizing enhancement in transmission waveform quality. The first current-signal generation circuit block has a current path connected between the differential output node, and a power source node, and is preferably implemented by a transistor of a one-step configuration, the transistor being driven ON by the one-shot pulse-signal. By so doing, a further increase in the transmission speed can be realized.

A second output driver circuit according to another aspect of the invention is provided with a voltage-signal generation circuit block for driving a differential output node by voltage according to the logical level of a differential input node, and a second current-signal generation circuit block for driving the differential output node by current at a first current value according to the logical level of the differential input node. In the voltage-signal generation circuit block, either a positive differential output node or a negative differential output nodes is connected to a first power source having a first voltage value via a first impedance, and the other of the positive and negative differential output nodes is connected to a second power source having a second voltage value via a second impedance. The first current value is set to (the first voltage value−the second voltage value)/(2×the first impedance).

With the use of such a configuration as described, even when the signal of the differential output node is kept in the stationary state in addition to the time when the signal of the differential output node is caused to make a transition, current-driving is executed by the second current-signal generation circuit block. Use of the second current-signal generation circuit block at the time of signal transition enables a higher transmission speed to be realized. With the use of the second current-signal generation circuit block while the signal is in the stationary state, a voltage amplitude of the differential output node can be expanded as compared with the case where use is made of voltage-driving by the voltage-signal generation circuit block. As a result, enhancement in transmission waveform quality can be realized. During a period of the signal transition, and while the signal is in the stationary state, the voltage-signal generation circuit block functions as the circuit for impedance matching. By so doing, enhancement in the transmission waveform quality can be realized.

A third output driver circuit according to still another aspect of the invention is made up by combining the first output driver circuit with the second output driver circuit. More specifically, at the time of signal transition at the differential output node, current-driving is mainly executed by the first and second current-signal generation circuit blocks, in which case, the first current-signal generation circuit block functions as a pre-emphasis circuit. By so doing, an increase in the transmission speed and enhancement in the transmission waveform quality can be realized. Thereafter, at the time when the signal of the differential output node is in the stationary state, current-driving is mainly executed by the second current-signal generation circuit block. By so doing, the voltage amplitude at the differential output node can be expanded, thereby realizing enhancement in the transmission waveform quality. During the period of the signal transition, and while the signal is in the stationary state, the voltage-signal generation circuit block functions as the circuit for impedance matching. By so doing, enhancement in the transmission waveform quality can be realized.

With the use of any of the first to the third output driver circuits, particularly, the second and third output driver circuits, the voltage amplitude at the differential output node can be selected out of a wide range according to a communication system to which the output driver circuit is applied. With the adoption of a configuration wherein the voltage amplitude can be selected out of a wide range, it becomes possible to realize reduction in power consumption kept in balance with enhancement in the transmission waveform quality.

Advantageous effects of the output driver circuit according to any of the representative embodiments of the invention disclosed under the present application include reduction in power consumption, and/or enhancement in the transmission waveform quality in addition to the increase in the transmission speed.

BRIEF DESCRIPTION OF THE DRAWINGS

FIG. 2A is a block diagram showing a part of a configuration example of the output driver circuit according to the first embodiment of the invention, FIG. 2B being a schematic representation showing one example of a relationship among power-supply voltages in FIG. 2A;

FIG. 13 is a circuit diagram showing a configuration example of an output driver circuit according to a fourth embodiment of the invention;

DETAILED DESCRIPTION OF THE PREFERRED EMBODIMENTS

Figure 1:
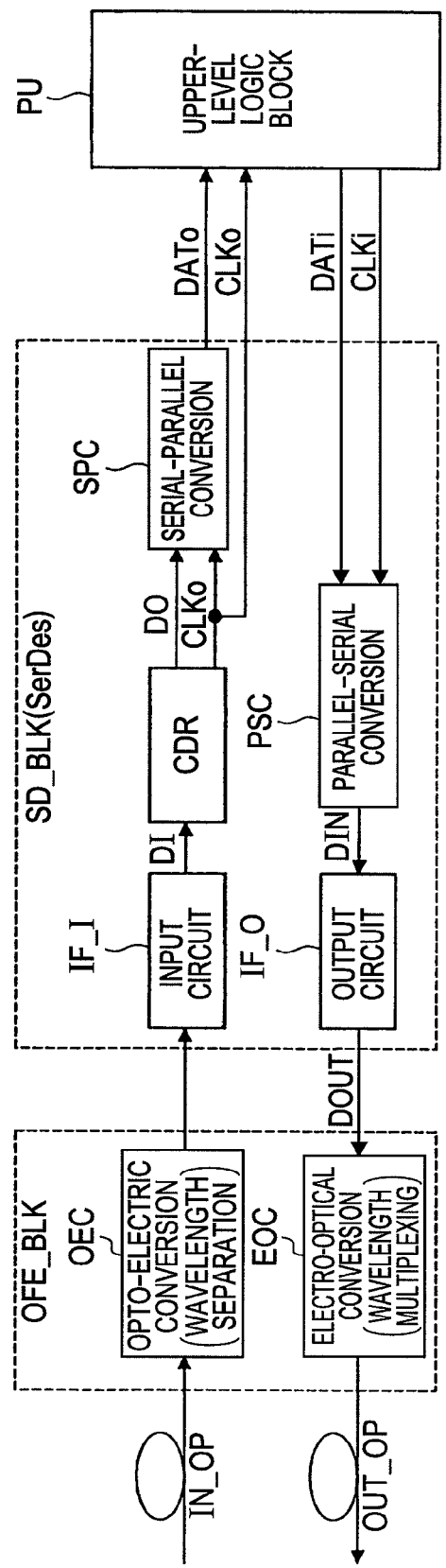
FIG. 1 is a block diagram showing a configuration example of an optical communication system to which an output driver circuit according to a first embodiment of the invention is applied.

The following embodiment of the invention is described by splitting the same into a plurality of sections or embodiments as necessary for convenience's sake, however, it is to be understood that those sections or embodiments are not unrelated to each other unless explicitly stated otherwise, but one thereof represents a part of the other thereof, a variation of the other in whole, or details, supplemental remarks, and so forth. Further, in the case where reference is made to the number, and so forth (including the number of units, a numerical value, quantity, scope, and so forth) as to elements of the following embodiment of the invention, the invention is not limited to a specified number, but the number, and so forth may be either not less than the specified number, or not more than the specified number unless explicitly stated otherwise, and unless obviously limited to the specified number on a theoretical basis.

Further, needless to say, constituent elements (including a step as an element, and so forth) of the following embodiment of the invention are not always essential unless explicitly stated otherwise, and unless obviously considered essential on a theoretical basis. Similarly, when mention is made of respective shapes of constituent elements, and so forth, and positional relation between the constituent elements, and so forth, in the following embodiment of the invention, the shapes, and so forth include those effectively approximate, or analogous thereto unless explicitly stated otherwise, and unless obviously considered otherwise on a theoretical basis. The same can be said of the numerical value, and the scope, described as above.

Further, circuit elements making up each of functional blocks of the following embodiment are formed on a semiconductor substrate made of a single crystal silicon by use of the known IC technology for CMOS (Complementary MOS transistors), and so forth. With the present embodiment, a MOSFET (Metal Oxide Semiconductor Field Effect Transistor) (abbreviated to MOS transistor) is used as an example of a MISFET (Metal Insulator Semiconductor Field Effect Transistor), however, a non-oxide film is not precluded as a gate insulating film. In the drawings, a symbol o is affixed to a p-channel MOS transistor (PMOS transistor) to be thereby differentiated from an n-channel MOS transistor (NMOS transistor). Further, in the drawings, connection of a substrate potential of a MOS transistor is not specifically shown, however, there is no particular limitation to a connection method thereof if the MOS transistor is present in a normally operable range.

Embodiments of the invention will be described hereinafter with reference to the drawings. In all the drawings for use describing the embodiments, identical members are in principle denoted by like reference numerals, thereby omitting detailed description thereof.

First Embodiment

FIG. 1 is a block diagram showing a configuration example of an optical communication system to which an output driver circuit according to a first embodiment of the invention is applied. The optical communication system shown in FIG. 1 is comprised of an opto-electric conversion block OFE_BLK, a serial/parallel conversion block (SerDes: SERializer/DESerializer) SD_BLK, and an upper-level logic block PU. OFE_BLK is provided with an opto-electric conversion circuit OEC for converting an optical input data signal IN_OP into an electric signal via, for example, a photodiode, and so forth, and an electro-optical conversion circuit EOC for converting the electric signal into an optical output data signal OUT_OP via a laser diode, and so forth.

SD_BLK is provided with input subsystem circuits including an input circuit IF_I for amplifying a minute data signal from OEC to a data signal at a predetermined voltage level, a signal regeneration circuit CDR for regenerating a data output signal DO, and a clock signal CLKo from a data input signal DI as an output of the input circuit IF_I, serial/parallel conversion circuit SPC wherein the data output signal DO to be turned into serial data is converted into a parallel data signal DATo by use of the clock signal CLKo. The upper-level logic block PU executes predetermined information-processing upon receiving the clock signal CLKo, and the parallel data signal DATo. Further, SD_BLK is provided with output subsystem circuits including a parallel/serial conversion circuit PSC wherein a parallel data signal DATi from the upper-level logic block PU is turned into a serial data signal by use of a clock signal CLKi from PU, and an output circuit IF_O for receiving an input signal DIN as an output of PSC, and driving the electro-optical conversion circuit EOC through the agency of a data output signal DOUT.

With such an optical communication system as described, high-speed communication at a transmission speed in excess of several tens of Gbps has been performed in recent years, and in consequence, there has occurred deterioration in transmission waveform quality, so that it has become increasingly difficult to expand the eye of the so-called eye pattern. Furthermore, there has been seen a rising demand for more power-saving in the system. Under circumstances described as above, if an output driver circuit according to any of the embodiments of the invention, described hereunder, is applied to, for example, the output circuit IF_O, and so forth, this will be rewarding.

FIG. 2A is a block diagram showing apart of a configuration example of the output driver circuit according to the first embodiment of the invention, and FIG. 2B is a schematic representation showing one example of a relationship among power-supply voltages in FIG. 2A. An output driver circuit TX_BK1 shown in FIG. 2A is provided with a voltage-signal generation circuit block VSG_BK, current-signal generation circuit blocks ISG_BKp1, ISG_BKn1, pulse-signal generation circuits PGEN1, PGEN 2, a positive output-node TXP, and a negative output-node TXN.

VSG_BK is provided with resistors Rp1, Rp2, Rn1, and Rn2, and switching circuits SWp1, SWp2, SWn1, and SWn2. The resistors Rp1, Rp2, Rn1, and Rn2 each have impedance Z0, and an output power-supply voltage VOH on the high potential side of the block is applied to one end of each of the resistors Rp1, Rp2 while an output power-supply voltage VOL on the low potential side of the block is applied to one end of each of the resistors Rn1, Rn2. The other end of each of the resistors Rp1, Rp2, Rn1, and Rn2 is connected to one end of each of the switching circuits SWp1, SWp2, SWn1, and SWn2, respectively. The other end of each of the switching circuits SWp1, SWp2 is connected to TXP, and the other end of each of the switching circuits SWn1, SWn2 is connected to TXN. SWp1, and SWn1 are controlled to be in the ON state when a positive data input signal DIN_P is at a 'H' level (a negative data input signal DIN_N is at a 'L' level) while SWp2, and SWn2 are controlled to be in the ON state when the negative data input signal DIN_N is at 'H' level (or the positive data input signal DIN_P is at 'L' level).

The pulse-signal generation circuit PGEN1 receives DIN_P, DIN_N, or both, and generates a pulse signal having a predetermined pulse width at the time when DIN_P makes a transition from the 'L' level to the 'H' level (or DIN_N makes a transition from the 'H' level to the 'L' level). The pulse-signal generation circuit PGEN2 receives DIN_P, DIN_N, or both, and generates the pulse signal having the predetermined pulse width at the time when DIN_N makes a transition from the 'L' level to the 'H' level (or DIN_P makes a transition from the 'H' level to the 'L' level) contrary to the case of PGEN1.

The circuit block ISG_BKp1 is provided with a constant current source IS1 whose one end is connected to a power-supply voltage VDD, and switching circuits SWp3, SWp4, respective ends thereof being connected to the other end of ISI, which is shared by SWp3, and SWp4. The other end of SWp3 is connected to TXP, and the other end of SWp4 is connected to TXN. Similarly, the circuit block ISG_BKn1 is provided with a constant current source IS2 with one end connected to a grounding power-supply voltage GND, and switching circuits SWn3, and SWn4, respective ends thereof being connected to the other end of IS2, in common with SWn3, and SWn4. The other end of SWn3 is connected to TXN, and the other end of SWn4 is connected to TXP. ISI1, and IS2 each are set to an identical potential value. SWp3 and SWn3 are driven ON for the duration of the pulse signal from PGEN1 being in the activated state, and SWp4 and SWn4 are driven ON for the duration of the pulse signal from PGEN2 being in the activated state.

Now, an external load resistor Rld having impedance (2×Z0) is connected between TXP and TXN. When DIN_P makes a transition from the 'L' level to the 'H' level in order to drive Rld, VOH is connected to TXP via SWp1, and VOL is connected to TXN via SWn1. On the contrary, when DIN_P makes a transition from the 'H' level to the 'L' level, VOH is connected to TXN via SWp2, and VOL is connected to TXP via SWn2. In respective states described as above, impedance matching is under way. However, Cp1, Cp2, relatively large in capacitance, are added to TXP, and TXN, respectively, following addition of a pad electrode, an ESD (Electro Static Discharge) element, and so forth. In consequence, a rise-rate, and a fall-rate of both TXP, and TXN are low, so that it is not possible to achieve an increase in transmission speed.

Therefore, upon DIN_P making a transition from the level to the 'H' level, PGEN1 outputs the pulse signal, driving SWp3 and SWn3 to be turned ON for the duration of the predetermined pulse width. By so doing, charging current from IS1 is supplied to TXP, and discharging current from IS2 is supplied to TXN, so that it is possible to perform both charging of Cp1, and discharging of Cp2 at a high speed. On the contrary, upon DIN_P making a transition from the 'H' level to the level, PGEN2 outputs the pulse signal, driving SWp4 and SWn4 to be turned ON for the duration of the predetermined pulse width. By so doing, charging current from IS1 is supplied to TXN, and discharging current from IS2 is supplied to TXP, so that it is possible to perform both discharging of Cp1, and charging of Cp2 at high speed.

If the output driver circuit shown in FIG. 2A is used as above, the following advantageous effects, for instance, can be obtained. Firstly, an increase in transmission speed can be realized. More specifically, charging/discharging of Cp1, Cp2, respectively, can be effected at a high speed upon the transition of data through the agency of the current-signal generation circuit blocks ISG_BKp1, and ISG_BKn1, respectively, so that effects of the capacitance can be reduced, thereby enabling the rise-rate, and the fall-rate of both TXP, and TXN to be enhanced. Secondly, enhancement in the transmission waveform quality can be realized. More specifically, since the constant current sources IS1, IS2 each normally have high impedance, an effect thereof on an impedance matching state, accompanying the voltage-signal generation circuit block VSG_BK, is small, so that IS1, IS2 each are insusceptible to waveform reflection. Further, if respective current values of IS1, IS2, and the pulse width of the pulse signal from PGEN1 are properly adjusted, this will enable proper pre-emphasis (waveform equalization) according to a communication system, thereby enhancing transmission waveform quality.

Figure 16A:
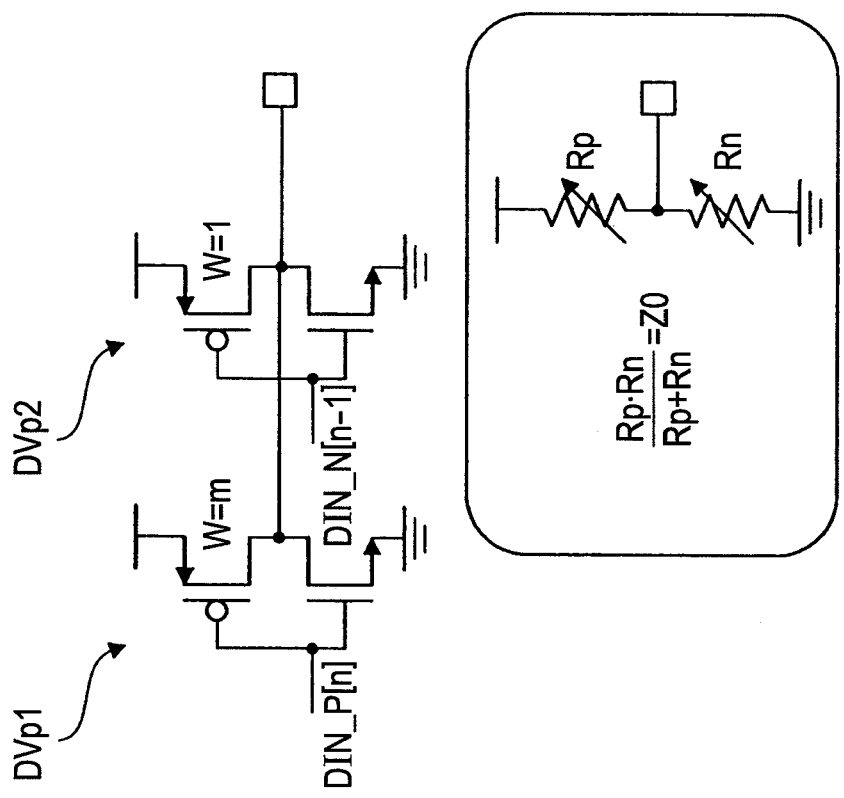
FIGS. 16A, 16B each are a circuit diagram showing another configuration example of the output driver circuit studied as the prerequisite for the invention.
Figure 16B:
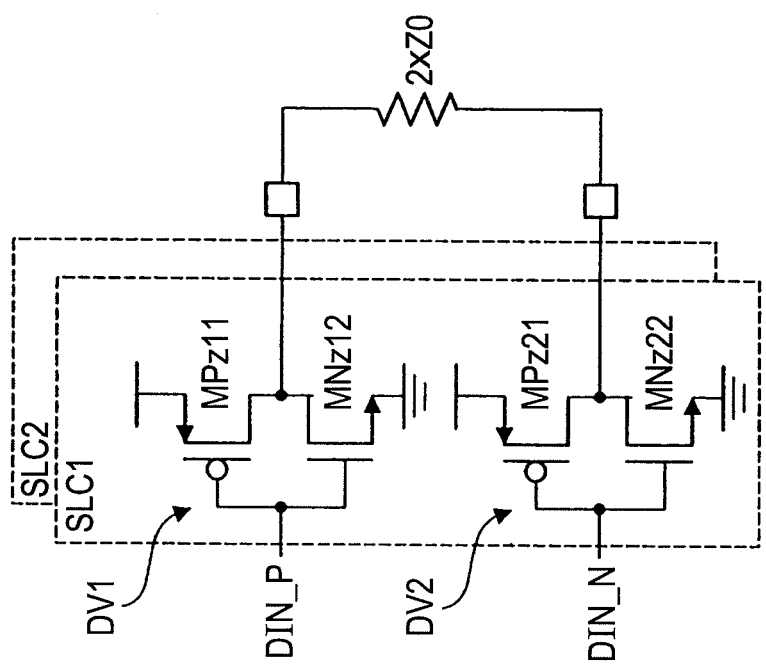

Thirdly, reduction in power consumption can be realized. More specifically, in the case of, for example, the configuration shown in FIG. 16, there is a concern about an increase in power consumption, following pre-emphasis, however, with the configuration example shown in FIG. 2A, an increase in power consumption can be checked by properly adjusting a pre-emphasis amount. For example, if the pulse width of the pulse signals from PGEN1, PGEN2, respectively, is rendered smaller in value than one cycle of a data rate upon execution of pre-emphasis, this will enable excessive pre-emphasis to be avoided as compared with the case where the pre-emphasis is executed for duration of one cycle in whole, thereby checking power consumption. However, if a large pre-emphasis amount according to the communication system is required in contrast to the above case, needless to say, the pulse width can be rendered larger in value than one cycle.

Fourthly, it becomes possible to realize reduction in power consumption kept in balance with enhancement in transmission waveform quality, while maintaining the increase in transmission speed. More specifically, when the pulse signals from PGEN1, PGEN2, respectively, are in the deactivated state (in other words, when data output signals from TXP, TXN, respectively, are in the stationary state), the external load resistor Rld will be voltage-driven by the voltage-signal generation circuit block VSG_BK. At this point in time, it will be desirable to decrease amplitude of the data output signal in the stationary state in order to reduce power consumption, however, if the amplitude is excessively decreased, the transmission waveform quality will deteriorate (that is, the eye of the eye pattern will undergo contraction). More specifically, in view of a tradeoff between the power consumption and the transmission waveform, quality, there exists the optimum amplitude according to a communication system in use, so that the output driver circuit preferably has a configuration wherein the amplitude can be selected in a wide range.

Meanwhile, on a side of the block, for decreasing the amplitude of the data output signal, a decrease in amplitude can be easily realized by decreasing VOH, and increasing VOL, but on a side of the block, for increasing the amplitude, a study will be required. For example, assuming that the constant current source IS1, IS2 are implemented by operation of a MOS transistor, in a saturation region, if a threshold voltage thereof is designated Vth, IS1 can increase a voltage at TXP, TXN, respectively, only up to VDD-Vth, and IS2 can decrease the voltage at TXP, TXN, respectively, only down to Vth. Accordingly, amplitude larger than that in those cases is generated through voltage-driving by VSG_BK. More specifically, loss by the Vth is compensated for by increasing VOH in VSG_BK, and decreasing VOL in VSG_BK, as shown in FIGS. 2A, 2B. In this case, there is a concern with deterioration in the rise-rate, and the fall-rate of both TXP, and TXN, following the voltage-driving by VSG_BK, however, in reality, TXP, TXN are driven by ISG_BKp1, ISG_BKn1, respectively, for most of signal-rising and signal-falling periods, so that deterioration in the rise-rate, and the fall-rate will not be much of a problem. Accordingly, with the use of the configuration example shown in FIG. 2A, the amplitude of the data output signal can be selected in the wide range.

Figure 3:
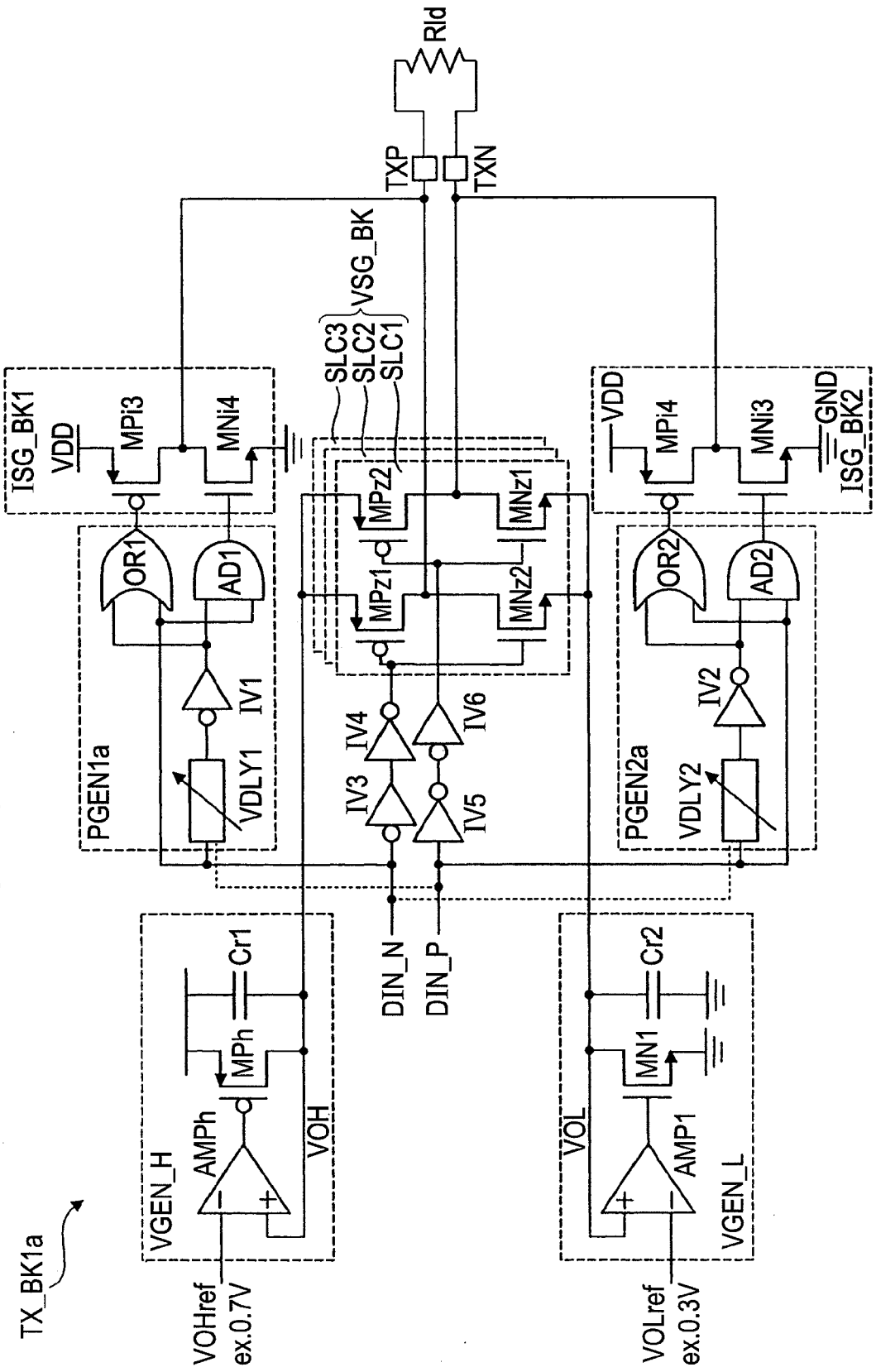
FIG. 3 is a circuit diagram showing a detailed configuration example of the output driver circuit shown in FIG. 2A.

FIG. 3 is a circuit diagram showing a detailed configuration example of the output driver circuit shown in FIG. 2A.

In FIG. 3, the output driver circuit TX_BK1a is provided with a voltage-signal generation circuit block VSG_BK, pulse-signal generation circuits PGEN1a, PGEN 2a, current-signal generation circuit blocks ISG_BK1, ISG_BK2, power supply generation circuits VGEN_H, VGEN_L, and a plurality of inverters IV3 to IV6.

VSG_BK is comprised of a plurality (in this case, 3 units) of slicing circuits SLC1 to SLC3. The slicing circuits SLC1 to SLC3 each are provided with a CMOS inverter circuit [1] comprised of a PMOS transistor MPz1, and an NMOS transistor MNz2, and a CMOS inverter circuit [2] comprised of a PMOS transistor MPz2, and an NMOS transistor MNz1. A negative data input signal DIN_N is inputted to the CMOS inverter circuit [1] via IV3, IV4, and a positive data input signal DIN_P is inputted to the CMOS inverter circuit [2] via IV5, IV6. MPz1, MPz2, MNz1, and MNz2 each correspond to Rpt and SWp1, Rp2 and SWp2, Rn1 and SWn1, and Rn2 and SWn2, shown in FIG. 2A, respectively. As previously described with reference to FIG. 16A, impedance on the PMOS transistor side, and impedance on the NMOS transistor side can be set to Z0, respectively, by setting the respective slicing circuits SLC1 to SLC3 as either valid or invalid, VGEN_H is a power source regulator circuit comprised of an amplifier AMPh, a PMOS transistor MPh, and a capacitor Cr1, generating an output power-supply voltage VOH on the high potential side. AMPh has a negative input node to which a set voltage VOHref (for example, 0.7V, and so forth) is inputted, and an output node connected to the gate of MPh while a positive input node of AMPh is connected to the drain of MPh. The source of MPh is connected to the power-supply voltage, and Cr1 extends between the source and the drain of MPh. If use is made of such a configuration as described, VOH having a value set at VOHref is outputted from the drain of MPh, whereupon VOH is supplied to VSG_BK, and IV3 to IV6.

VGEN_L is a power source regulator circuit comprised of an amplifier AMP1, an NMOS transistor MN1, and a capacitor Cr2, generating an output power-supply voltage VOL on the low potential side. AMP1 has a negative input node to which a set voltage VOLref (for example, 0.3V, and so forth) is inputted, and an output node connected to the gate of MN1 while the positive input node of AMP1 is connected to the drain of MN1. The source of MN1 is connected to grounding power-supply voltage, and Cr2 extends between the source and the drain of MN1. If use is made of such a configuration as described, VOL having a value set at VOLref is outputted from the drain of MN1, whereupon VOL is supplied to VSG_BK, and IV3 to IV6.

The pulse-signal generation circuit PGEN1a is comprised of a variable delay circuit VDLY1, an inverter IV1, an OR circuit OR1, and an AND circuit AD1. VDLY1 receives the data input signal DIN_N (or DIN_P), which is delayed by predetermined time. The inverter IV1 inverts the signal as delayed before outputting a signal. OR1 receives DIN_N, and the output signal from IV1, thereby executing the logical OR operation. AD1 receives DIN_N, and the output signal from IV1, thereby executing the logical AND operation.

Meanwhile, PGEN 2a is comprised of a variable delay circuit VDLY2, an inverter IV2, an OR circuit OR2, and an AND circuit AD2. DLY2 receives the data input signal DIN_P (or DIN_N), which is delayed by predetermined time. The inverter IV2 inverts the signal as delayed before outputting it. OR2 receives DIN_P, and an output signal from IV2, thereby implementing the logical OR operation. AD2 receives DIN_P, and the output signal from IV2, thereby implementing the logical AND operation.

The current-signal generation circuit block ISG_BK1 is comprised of a PMOS transistor MPi3, and an NMOS transistor MNi4. MPi3 has a source connected to the power-supply voltage VDD, and a drain connected to TXP while the gate of MPi3 is controlled by an output of OR1. MNi4 has a source connected to the grounding power-supply voltage GND, and a drain connected to TXP while the gate of MNi4 is controlled by an output of AD1. MPi3 corresponds to ISI, and SWp3 in FIG. 2, and MNi4 corresponds to IS2, and SWn4 in FIG. 2.

ISG_BK2 is comprised of a PMOS transistor MPi4, and an NMOS transistor MNi3. MPi4 has a source connected to the power-supply voltage VDD, and a drain connected to TXN while the gate of MPi4 is controlled by an output of OR2. MNi3 has a source connected to the grounding power-supply voltage GND, and a drain connected to TXN while the gate of MNi3 is controlled by an output of AD2.

MPi4 corresponds to ISI, and SWp4 in FIG. 2, and MNi3 corresponds to IS2, and SWn3 in FIG. 2.

Figure 4A:
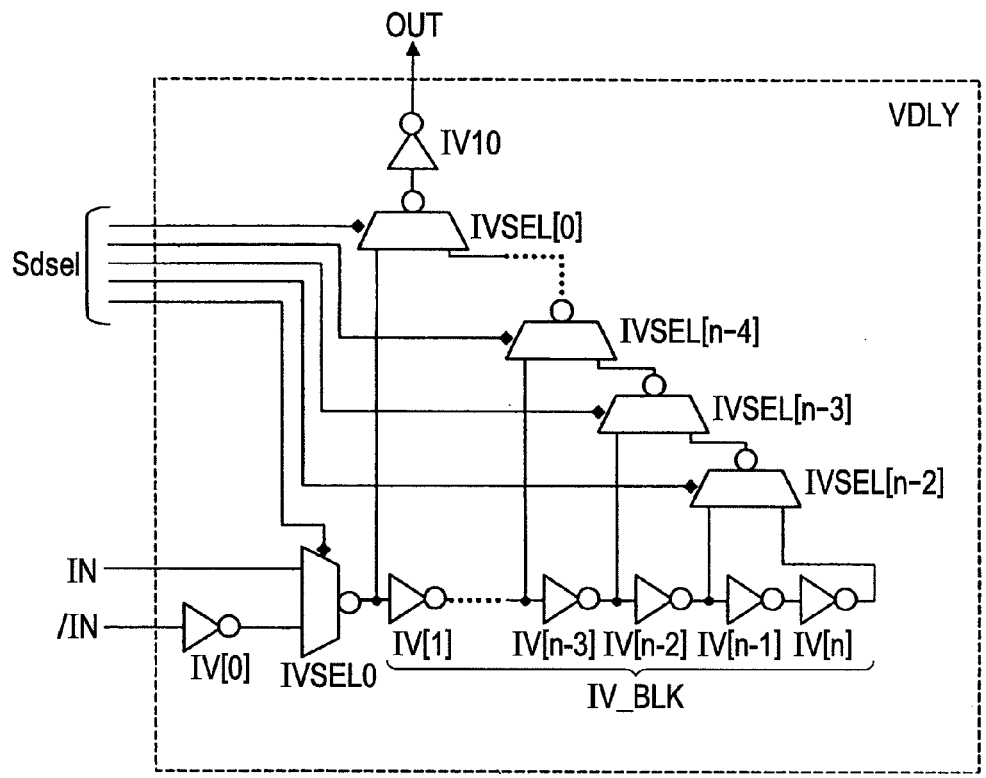
FIG. 4A is a circuit diagram showing a detailed configuration example of a variable delay circuit VDLY in a pulse-signal generation circuit PGEN of FIG. 3, FIG. 4B being a circuit diagram showing a detailed configuration example of an inversion selector circuit in FIG. 4A.
Figure 4B:
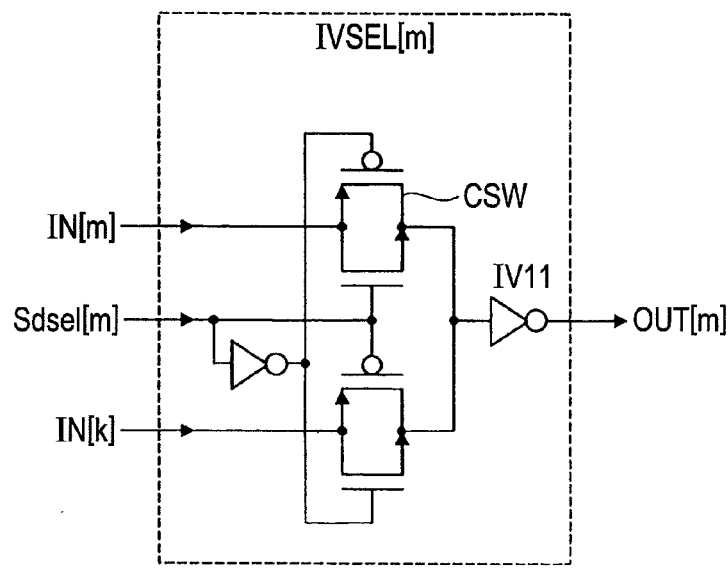

FIG. 4A is a circuit diagram showing a detailed configuration example of the variable delay circuit VDLY in the pulse-signal generation circuit PGEN of FIG. 3. FIG. 4B is a circuit diagram showing a detailed configuration example of an inversion selector circuit in FIG. 4A. The variable delay circuit VDLY shown in FIG. 4A is comprised of a delay inverter IV [0], an inversion selector IVSEL0 having two inputs, n units of delay inverters IV [1] to IV [n], connected in series in the order of output, (n−1) units of inversion selectors IVSEL [0] to IVSEL (n−2), each having two inputs, and an inverter IV10. IVSEL0 selects an input signal IN, or a signal obtained by delaying an inverting input signal (/IN) through the agency of IV [0] on the basis of a delay amount select signal Sdsel before outputting.

One input of IVSEL (n−2) is an output of the delay inverter IV [n−2], and the other input thereof is an output of the delay inverter IV [n]. One input of IVSEL (n−3) is an output of IV [n−3], and the other input thereof is an output of IVSEL (n−2). One input of IVSEL (n−4) is an output of IV [n−4] (not shown, a stage preceding IV [n−3]), and the other input thereof is an output of IVSEL (n−3). That is, IVSEL (n−3) to IVSEL [1] are similar in respect of connection relationship, and one input of IVSEL [m] is an output of IV [m] while the input thereof is an output of IVSEL [m+1]. Further, one input of IVSEL [0] is an output of IVSEL0, and the other input thereof is an output of IVSEL [1]. An output of IVSEL [0] will be an output signal OUT via IV10. Respective selection paths of the inversion selectors IVSEL [0] to IVSEL (n−2) are controlled by the delay amount select signal Sdsel.

Further, as shown in FIG. 4B, the inversion selectors IVSEL0, and IVSEL [m] are each provided with two units of CMOS switching circuits CSW, each thereof, having one end connected to one of the two inputs of the respective inversion selectors, and the other end connected to a common node, and an inverter IV11 for inverting a signal from the common node before outputting it. ON and OFF of the two units of CSW are complementarily controlled on the basis of the delay amount select signal Sdsel [m], and an inverting signal thereof.

In the case of such a configuration as is described above, on the assumption that a delay amount of each IVSEL [m] is equal to a delay amount (designated as Tdly) of the delay inverter IV [m], firstly, a delay amount at the time when the minimum delay is set is a delay amount at the time when the input signal IN is outputted via IVSEL0, IVSEL [0], and IV10. Then, the second smallest delay amount is a delay amount at the time when the inverting input signal (/IN) is outputted via IVSEL0, IVSEL [0], and IV10, in which case, Tdly is added to the delay amount at the time when the minimum delay is set. Subsequently, the third smallest delay amount is a delay amount at the time when he input signal IN is outputted via IVSEL0, IV [1], IVSEL [1], IVSEL [0], and IV10, in which case, Tdly is added to the second smallest delay amount. Thereafter, a delay amount can be similarly controlled in steps of Tdly. By so doing, a pulse width of the signal from the pulse-signal generation circuits PGEN1a, and PGEN 2a, respectively, can be set so as to have a high resolution.

Figure 5:
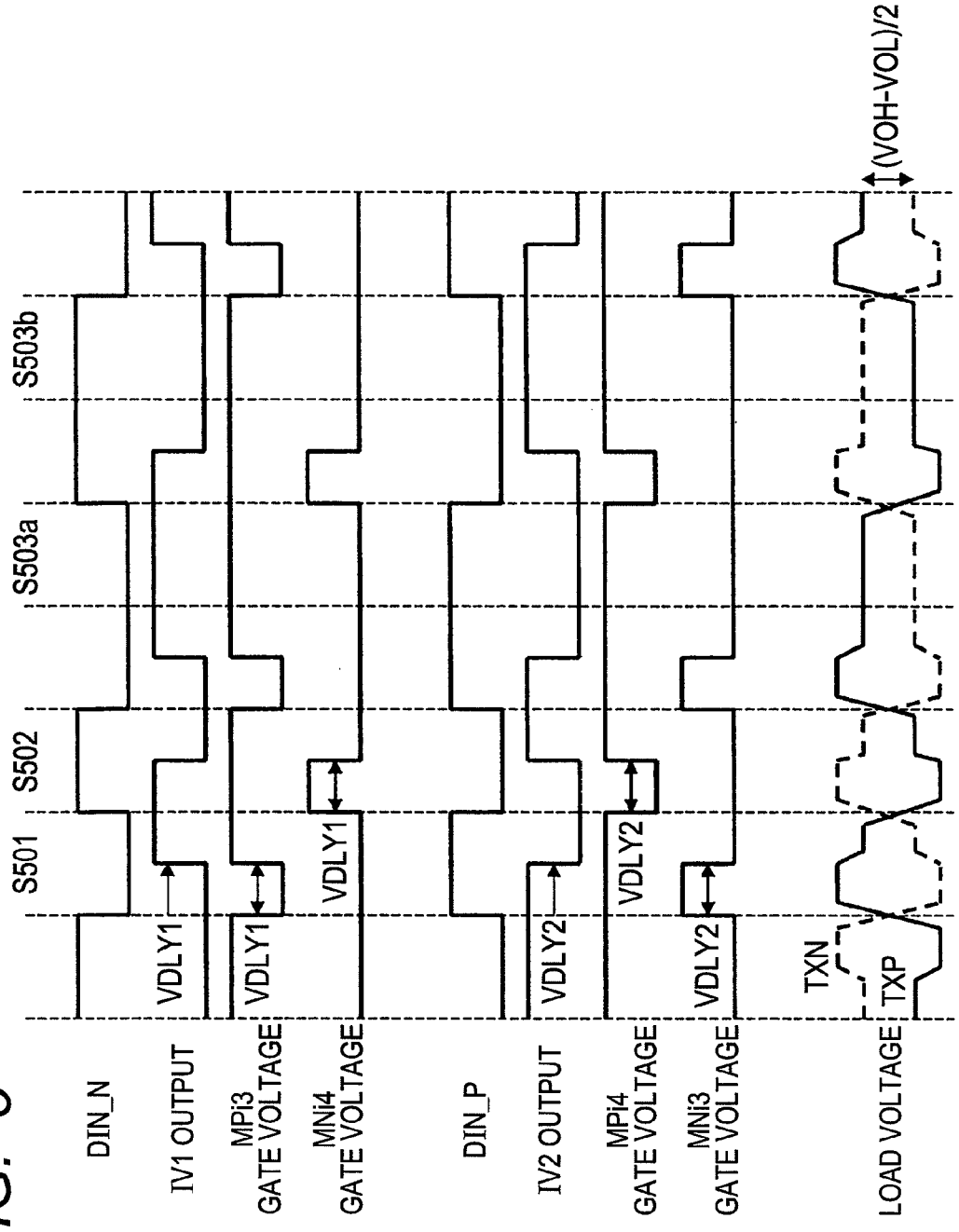
FIG. 5 is a waveform chart showing an example of an operation of the output driver circuit shown in FIG. 3.

FIG. 5 is a waveform chart showing an example of an operation of the output driver circuit TX_BK1a shown in FIG. 3.

For example, when DIN_P has made a transition from the 'L' level to the 'H' level (or DIN_N has made a transition from the 'H' level to the 'L' level), as shown in a cycle S501 of FIG. 5, a signal obtained by applying delay of VDLY2, and reversal to DIN_P is outputted from IV2, and a signal obtained by applying delay of VDLY1, and reversal to DIN_N is outputted from IV1. By so doing, an 'L' pulse signal having a pulse width based on a delay amount of VDLY1 is applied to the gate of MPi3, and an 'H' pulse signal having a pulse width based on a delay amount of VDLY2 is applied to the gate of MNi3. Thence, current from TXN toward TXP flows via MPi3, and MNi3 for the duration of the pulse width.

Further, when DIN_N has made a transition from the 'H' level to the 'L' level (or DIN_P has made a transition from the 'L' level to the 'H' level), as shown in a cycle S502 of FIG. 5, a signal obtained by applying delay by VDLY1, and reversal to DIN_N is outputted from IV1. By so doing, an 'H' pulse signal having the pulse width based on the delay amount of VDLY1 is applied to the gate of MNi4, and an 'L' pulse signal having the pulse width based on the delay amount of VDLY2 is applied to the gate of MPi4. Thence, current from TXN toward TXP flows via MPi4, and MNi4 for the duration of the pulse width.

Meanwhile, as shown by cycles S503a, S503b, respectively, in FIG. 5, when DIN_P is held at the 'H' level (or DIN_N is held at the 'L' level), or DIN_P is held at the 'L' level (or DIN_N is held at the 'H' level), NPi3, MNi4, MPi4, and MNi3 are held in the OFF state, whereupon TXP, and TXN are driven by VSG_BK. If the external load resistor Rld having impedance at 2×Z0 is connected between TXP and TXN at this point in time, impedance on the PMOS transistor side of VSG_BK, and impedance on the NMOS transistor side of VSG_BK are at Z0, respectively, so that there occurs a voltage amplitude at (VOH−VOL)/2.

Now, if the output driver circuit TX_BK1a shown in FIG. 3 is used as above, the following advantageous effects, for instance, can be obtained in addition to the various advantageous effects described with reference to FIG. 2. Firstly, the constant current source, and the switching circuit (for example, IS1 and SWp3), provided in each of the current-signal generation circuit blocks ISG_BKp1, ISG_BKn1, shown in FIG. 2, are implemented by one unit of the PMOS transistor (for example, MPi3) provided in each of the current-signal generation circuit blocks ISG_BK1, ISG_BK2, shown in FIG. 3, so that a further increase in the transmission speed can be realized. More specifically, for example, if the constant current source, and the switching circuit are implemented by MOS transistors that are vertically stacked in two steps, there is the risk that this will interfere with an increase in the rise-rate, and the fall-rate owing to a delay component of the MOS transistor. In contrast, if the constant current source, and the switching circuit are implemented by a MOS transistor in one step, a sufficiently higher speed can be realized.

Secondly, since VOH, VOL are supplied by the power supply generation circuits VGEN_H, VGEN_L, each serving as the power source regulator circuit, respectively, sufficient current can be supplied to the external load resistor Rld, and sufficient impedance matching can be realized. More specifically, on the assumption that the impedance (resistance value) of Rld is, for example, 100Ω, current at 4 mA is required if a voltage amplitude of 0.4 V is to be gained between TXP and TXN. Meanwhile, in order to carry out high-precision impedance matching in the voltage-signal generation circuit block VSG_BK, it is desirable to bring respective line impedances of VOH, and VOL close to zero as much as possible. Accordingly, use is made of the power source regulator circuit, whereupon a relatively large current can be supplied at low output impedance, so that such a demand as above can be met.

Thus, with the use of the output driver circuit according to the first embodiment of the invention, it is possible to typically realize reduction in power consumption in addition to an increase in transmission speed. Further, it is also possible to attain enhancement in transmission waveform quality in addition to the increase in transmission speed.

Second Embodiment

With a second embodiment of the invention, there is described a variation of the output driver circuit TX_BK1a according to the first embodiment of the invention, described with reference to FIG. 3.

Figure 6:
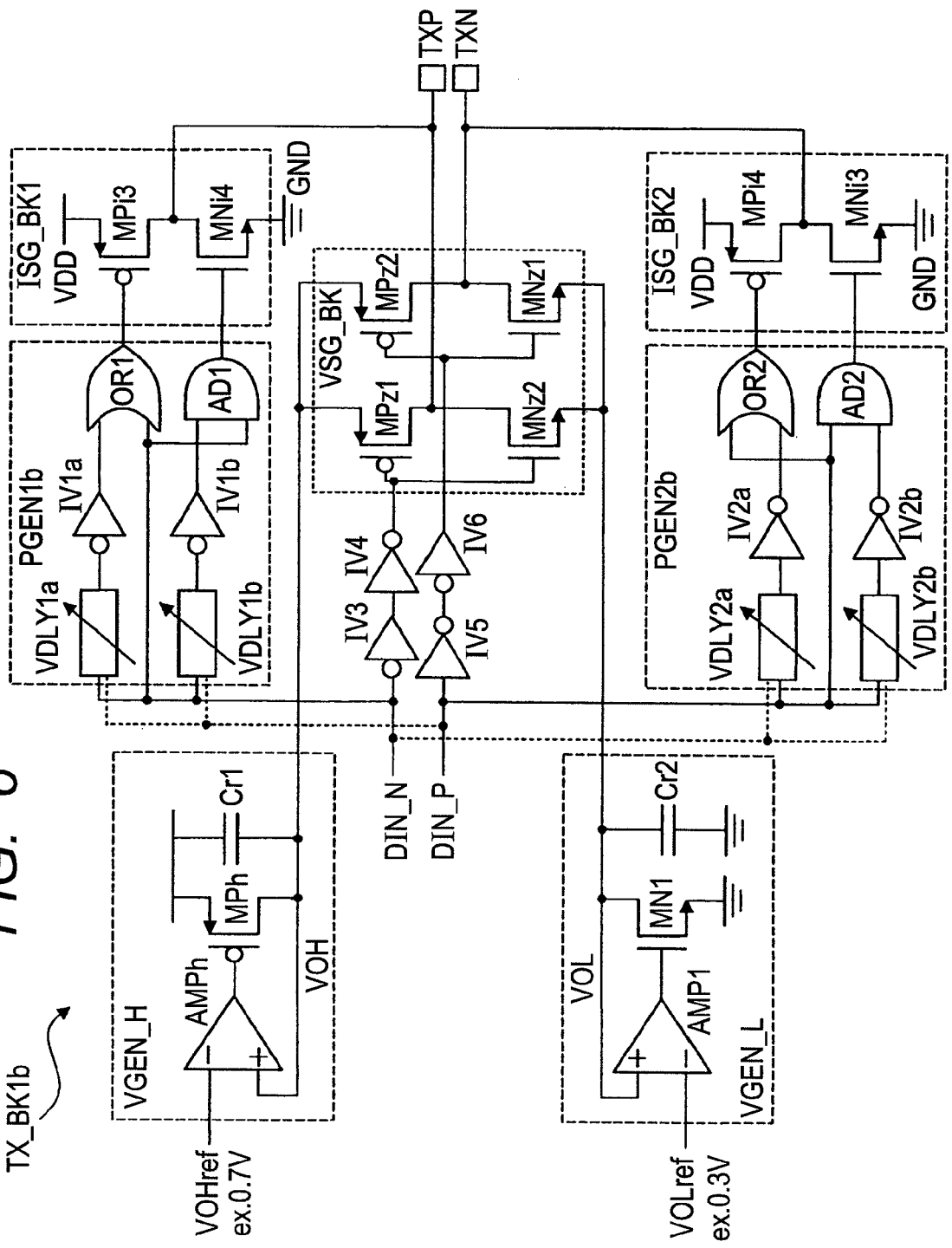
FIG. 6 is a circuit diagram showing a configuration example of an output driver circuit according to a second embodiment of the invention.

FIG. 6 is a circuit diagram showing a configuration example of an output driver circuit according to the second embodiment of the invention. The output driver circuit TX_BK1b shown in FIG. 6 has a configuration wherein pulse-signal generation circuits PGEN1b, PGEN 2b, shown in FIG. 6, are substituted for the pulse-signal generation circuits PGEN1a, PGEN 2a, shown in FIG. 3, respectively, as is evident when compared with the output driver circuit TX_BK1a shown in FIG. 3. The configuration shown in FIG. 6 differs from that in FIG. 3 in that a voltage-signal generation circuit block VSG_BK is made up of one unit of slicing circuit. Otherwise, FIG. 6 is identical in configuration to FIG. 3, omitting therefore detailed description thereof.

Herein, since VSG_BK is made up of the one unit of the slicing circuit, impedance thereof is adjusted by controlling a voltage value of VOH on the high potential side, and a voltage value of VOL on the low potential side, in contrast the case of FIG. 3. In this case, a circuit area can be rendered smaller as compared with the case of FIG. 3. On the other hand, however, respective values of VOH, VOL cannot be freely selected. Accordingly, in case that impedance, and the respective values of VOH, VOL need be independently set, it is necessary to provide the plurality of the slicing circuits as shown in FIG. 3.

PGEN1b is comprised of variable delay circuits VDLY1a, VDLY1b, inverters IV1a, IV1b, an OR circuit OR1, and an AND circuit AD1. VDLY1a, VDLY1b each receive a data input signal DIN_N (or DIN_P), which is delayed by predetermined time. The inverter IVla inverts the signal delayed by VDLY1a before outputting a signal. The inverter IV1b inverts the signal delayed by VDLY1b before outputting a signal. OR1 receives DIN_N, and the output signal from IV1a, thereby executing the logical OR operation. AD1 receives DIN_N, and the output signal from IV1b, thereby executing the logical AND operation. In the current-signal generation circuit block ISG_BK1, a PMOS transistor MPi3 is driven by the output of OR1, and an NMOS transistor MNi4 is driven by the output of AD1.

PGEN2b is comprised of variable delay circuits VDLY2a, VDLY2b, inverters IV2a, IV2b, an OR circuit OR2, and an AND circuit AD2. VDLY2a, VDLY2b each receive DIN_P (or DIN_N) (or), which is delayed by predetermined time. The inverter IV2a inverts the signal delayed by VDLY2a before outputting a signal. The inverter IV2b inverts the signal delayed by VDLY2b before outputting a signal. OR2 receives DIN_P, and the output signal from IV2a, thereby executing the logical OR operation. AD2 receives DIN_P, and the output signal from IV2b, thereby executing the logical AND operation. In the current-signal generation circuit block ISG_BK2, a PMOS transistor MPi4 is driven by the output of OR2, and an NMOS transistor MNi3 is driven by the output of AD2.

Figure 7:
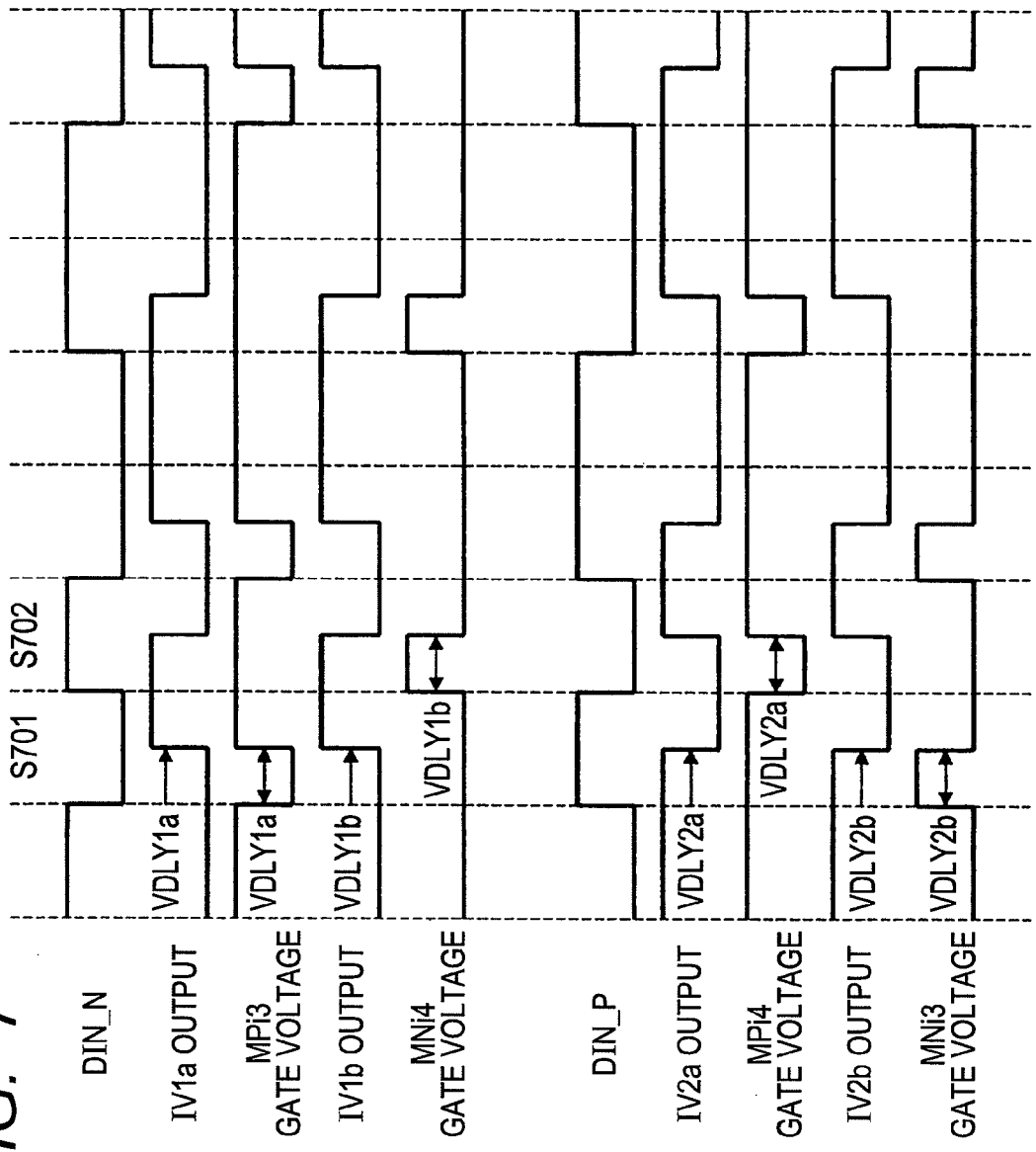
FIG. 7 is a waveform chart showing an example of an operation of the output driver circuit shown in FIG. 6.

FIG. 7 is a waveform chart showing an example of an operation of the output driver circuit TX_BK1b shown in FIG. 6.

For example, when DIN_P has made a transition from the 'L' level to the 'H' level (or DIN_N has made a transition from the 'H' level to the 'L' level), as shown in a cycle 5701 of FIG. 7, the gate of MPi3 is driven by an 'L' pulse signal having a pulse width of VDLY1a, and the gate of MNi3 is driven by a 'H' pulse signal having a pulse width of VDLY2b. Thence, current from TXP toward TXN flows via MPi3, and MNi3 for the duration of the pulse width.

Further, when DIN_P has made a transition from the 'H' level to the 'L' level (or DIN_N has made a transition from the 'L' level to the 'H' level), as shown in a cycle S702 of FIG. 7, the gate of MPi4 is driven by an 'L' pulse signal having a pulse width of VDLY2a, and the gate of MNi4 is driven by a 'H' pulse signal having a pulse width of VDLY1b. Thence, current from TXP toward TXN flows via MPi4, and MNi4 for the duration of the pulse width.

If such a configuration example as above is adopted, ON-pulse width can be individually set for each of MPi3, MNi3, MPi4, and MNi4, so that it is possible to check deterioration in transmission waveform quality, due to manufacturing variations, and so forth. More specifically, in case that a relative variation in transistor size occurs among MPi3, MNi3, MPi4, and MNi4, an imbalance between charging current, and discharging current can result, raising a possibility of deterioration in the transmission waveform quality. In the case of the configuration example shown in FIG. 3, the pulse width is set on the basis of two transistors among MPi3, MNi3, MPi4, MNi4, as a unit, so that it has been difficult to adjust all the relative variations among MPi3, MNi3, MPi4, and MNi4. However, with the configuration example shown in FIG. 6, the pulse width can be individually set for all the transistors, so that it is possible to adjust all the relative variations.

Thus, with the use of the output driver circuit according to the second embodiment of the invention, it is possible to typically realize reduction in power consumption in addition to an increase in transmission speed, as is the case with the first embodiment. Further, it is also possible to attain enhancement in transmission waveform quality in addition to the increase in transmission speed. Furthermore, further enhancement in the transmission waveform quality can be realized as compared with the case of the first embodiment.

Third Embodiment

With the output driver circuits according to the first and second embodiments, respectively, use is made of a mode wherein the output driver circuit is driven by a current signal at the time when the data signals makes a transition while the output driver circuit is driven by a voltage signal at the time when the data signals are in the stationary state, however, with an output driver circuit according to a third embodiment of the invention, there is described hereinafter a mode wherein the output driver circuit is driven by a current signal even at the time when the data signals are in the stationary state.

Figure 8B:
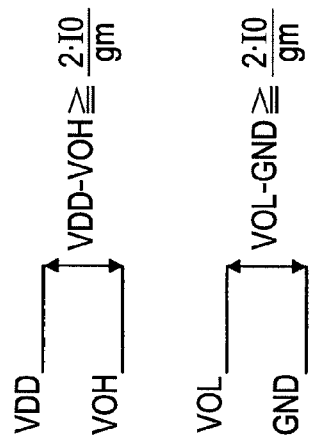
FIG. 8A is a circuit diagram showing a configuration example of an output driver circuit according to a third embodiment of the invention, FIG. 8B being a schematic representation showing one example of a relationship among power-supply voltages in FIG. 8A.
Figure 8A:
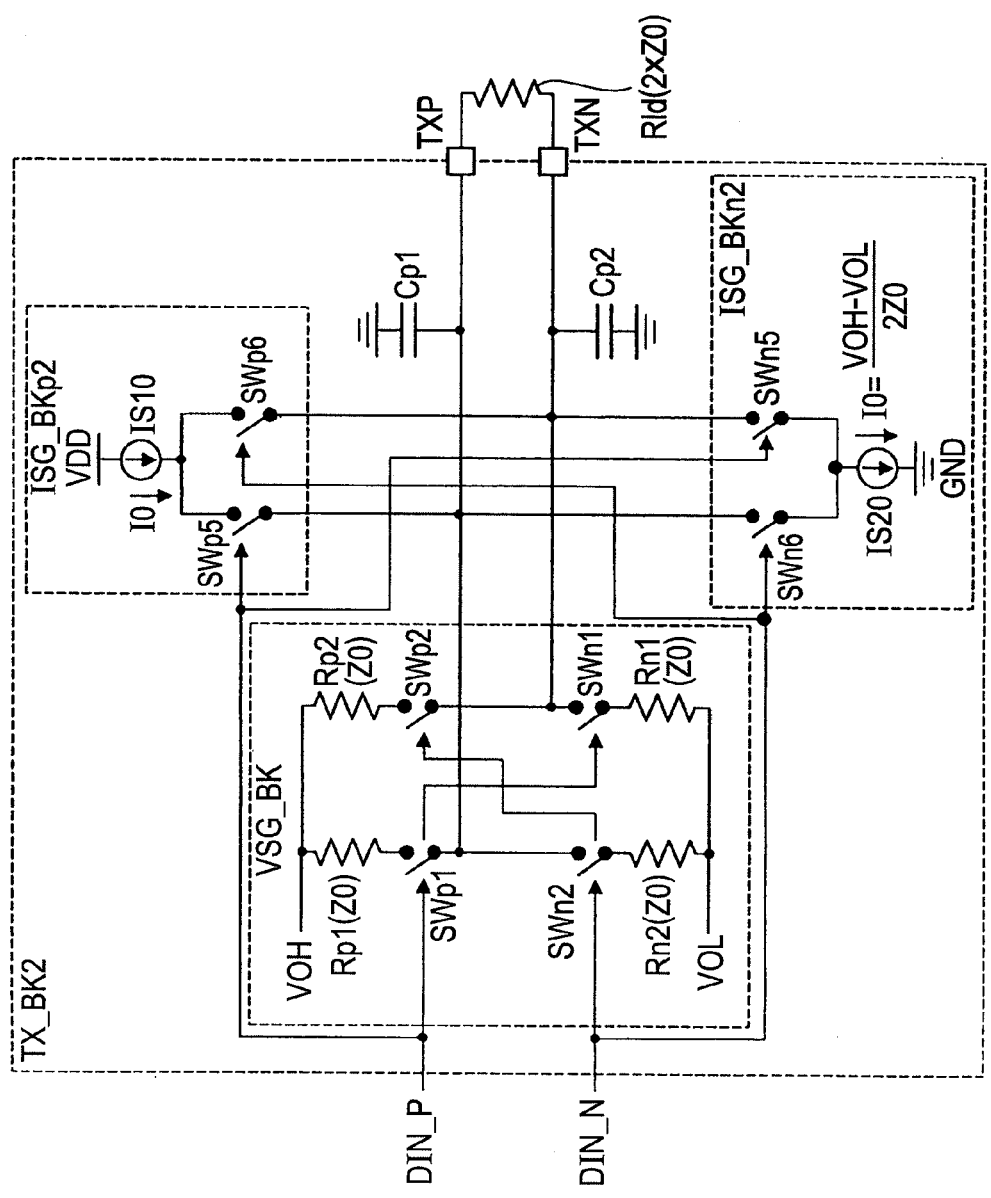
Figure 9:
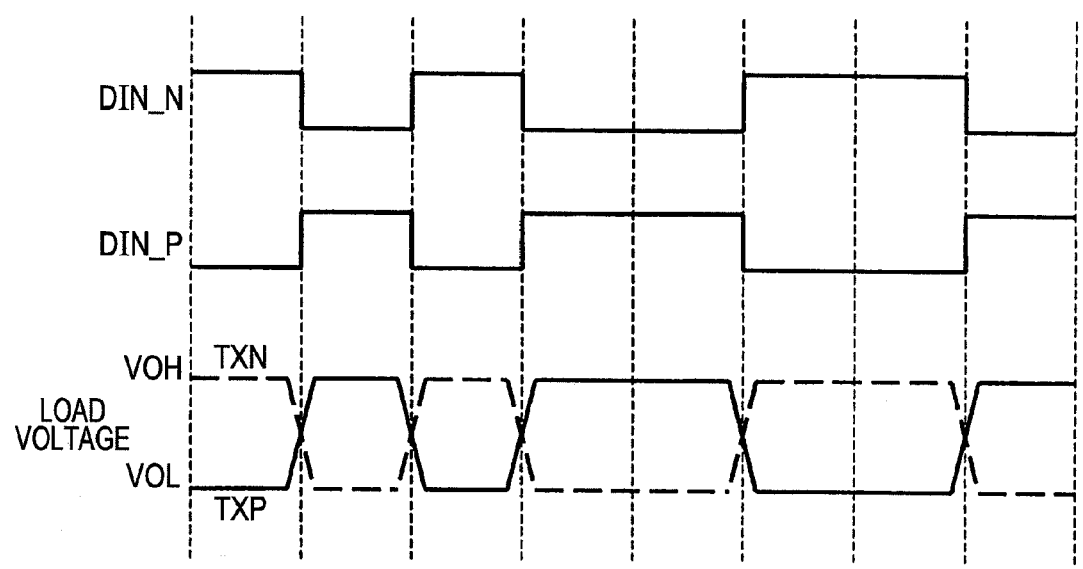
FIG. 9 is a waveform chart showing an example of an operation of the output driver circuit shown in FIG. 8A.

FIG. 8A is a circuit diagram showing a configuration example of an output driver circuit according to the third embodiment of the invention, and FIG. 8B is a schematic representation showing one example of a relationship among power-supply voltages in FIG. 8A. FIG. 9 is a waveform chart showing an example of an operation of the output driver circuit shown in FIG. 8A.

An output driver circuit TX_BK2 shown in FIG. 8A is provided with a voltage-signal generation circuit block VSG_BK, current-signal generation circuit blocks ISG_BKp2, ISG_BKn2, a positive output-node TXP, and a negative output-node TXN. More specifically, TX_BK2, shown in FIG. 8A, has a configuration wherein the pulse-signal generation circuits PGEN1, PGEN 2, shown in FIG. 2A, are omitted as compared with the output driver circuit TX_BK1 shown in FIG. 2A, and current-signal generation circuit blocks ISG_BKp2, ISG_BKn2, shown in FIG. 8A, are substituted for the current-signal generation circuit blocks ISG_BKp1, ISG_BKn1, shown in FIG. 2A, respectively.

VSG_BK is provided with resistors Rp1, Rp2, Rn1, Rn2, each having impedance Z0, and switching circuits SWp1, SWp2, SWn1, SWn2, as is the case with the configuration shown in FIG. 2A, and the output power-supply voltage VOH on the high potential side is supplied to one end of each of the resistors Rp1, Rp2 while the output power-supply voltage VOL on the low potential side is supplied to one end of each of the resistors Rn1, Rn2.

ISG_BKp2 is provided with a constant current source IS10 whose one end is connected to the power-supply voltage VDD, and switching circuits SWp5, SWp6, respective ends thereof being connected to the other end of ISI0, which is shared by SWp5, and SWp6. The other end of SWp5 is connected to TXP, and the other end of SWp6 is connected to TXN. Similarly, ISG_BKn2 is provided with a constant current source IS20 with one end connected to the grounding power-supply voltage GND, and switching circuits SWn5, and SWn6, respective ends thereof being connected to the other end of IS20, which is shared by SWn5, and SWn6. The other end of SWn5 is connected to TXN, and the other end of SWn6 is connected to TXP. IS10, and IS20 each are set to an identical current value I0. SWp5 and SWn5 are driven ON when a positive data input signal DIN_P is at the 'H' level (a negative data input signal DIN_N is at a 'L' level) while SWp6 and SWn6 are driven ON when the positive data input signal DIN_P is at the 'L' level (the negative data input signal DIN_N is at the 'H' level)

Herein, the current value I0 of each of IS10, and IS20 is set to (VOH–VOL)/(2×Z0). By so doing, in the case where an external load resistor Rld having impedance (2×Z0) is connected between TXP and TXN, voltage amplitude at (VOH–VOL) can be obtained between TXP and TXN, as shown in FIG. 9. For example, if voltage-driving by VSG_BK is used in the stationary state, the voltage amplitude at (VOH–VOL)/2 will occur, as shown in FIG. 5. In this case, in order to increase the voltage amplitude to thereby enhance the transmission waveform quality (to expand the eye of the eye pattern), it is necessary to increase VOH while decreasing VOL, which means that in order to generate a higher VOH, a still higher power supply voltage is consequently required.

Accordingly, if the configuration example shown in FIG. 8A is adopted, IS10, IS20 each not only execute current-driving at the time of data transition, but also generate a voltage at a level in the stationary state, so that it becomes possible to expand a voltage amplitude for the external load resistor Rld without use of a high power supply voltage while maintaining high-speed characteristics of the rise-rate, and the fall-rate. If the voltage amplitude between TXP and TXN is at (VOH–VOL), input/output of current by VOH/VOL of the voltage-signal generation circuit block VSG_BK, will, in effect, not occur, so that VSG_BK will function only as a circuit for impedance matching.

Further, a voltage relationship between GND and VOL as well as between VDD and VOH needs to satisfy a relation of $(VDD-VOH) \geq \{(2 \times I0)/gm\}$, and $(VOL-GND) \geq \{(2 \times I0)/gm\}$, as shown in FIG. 8B, in the case where IS10, and IS20 are implemented by operation of a MOS transistor, in a saturation region. Herein, "gm" refers to mutual inductance of the MOS transistor. Accordingly, even in the case of using the current-driving in the stationary state, there exists, in practice, an upper limit to a range where the voltage amplitude for Rld can be expanded, however, the voltage amplitude can be sufficiently expanded as compared with the case of using the voltage-driving.

Thus, with the use of the output driver circuit shown in FIG. 8, for example, the following advantageous effects can be obtained. Firstly, an increase in transmission speed can be realized. More specifically, as it is possible to execute charging/discharging of parasitic capacitors Cp1, Cp2, occurring to TXP, TXN, respectively, through the agency of the current-signal generation circuit blocks ISG_BKp2, ISG_BKn2, respectively, at the time of data transition, effect of those capacitances can be reduced, thereby improving the rise-rate, and the fall-rate of TXN as well as TXP. Secondly, it is possible to realize enhancement in transmission waveform quality. More specifically, since the constant current sources IS10, IS20 each normally have a high impedance, impedance matching can be mainly performed by the voltage-signal generation circuit block VSG_BK, thereby checking waveform reflection.

Thirdly, it becomes possible to achieve reduction in power consumption kept in balance with enhancement in transmission waveform quality, while maintaining the increase in transmission speed.

More specifically, in view of a tradeoff between the power consumption and the transmission waveform quality, there exists the optimum amplitude of a data output signal in the stationary state, according to a communication system in use, as described with reference to FIG. 2. In this case, a problem exists on the side of the block, for increasing the amplitude. That is, in the case where an amplitude of the data output signal in the stationary state is generated by the voltage-signal generation circuit block VSG_BK as is the case of the configuration example shown in FIG. 2A, it is impossible to expand the amplitude unless the power supply voltage is increased as previously described. However, with the use of the configuration example shown in FIG. 8, expansion of the amplitude can be realized by application of a lower power supply voltage.

Figure 10:
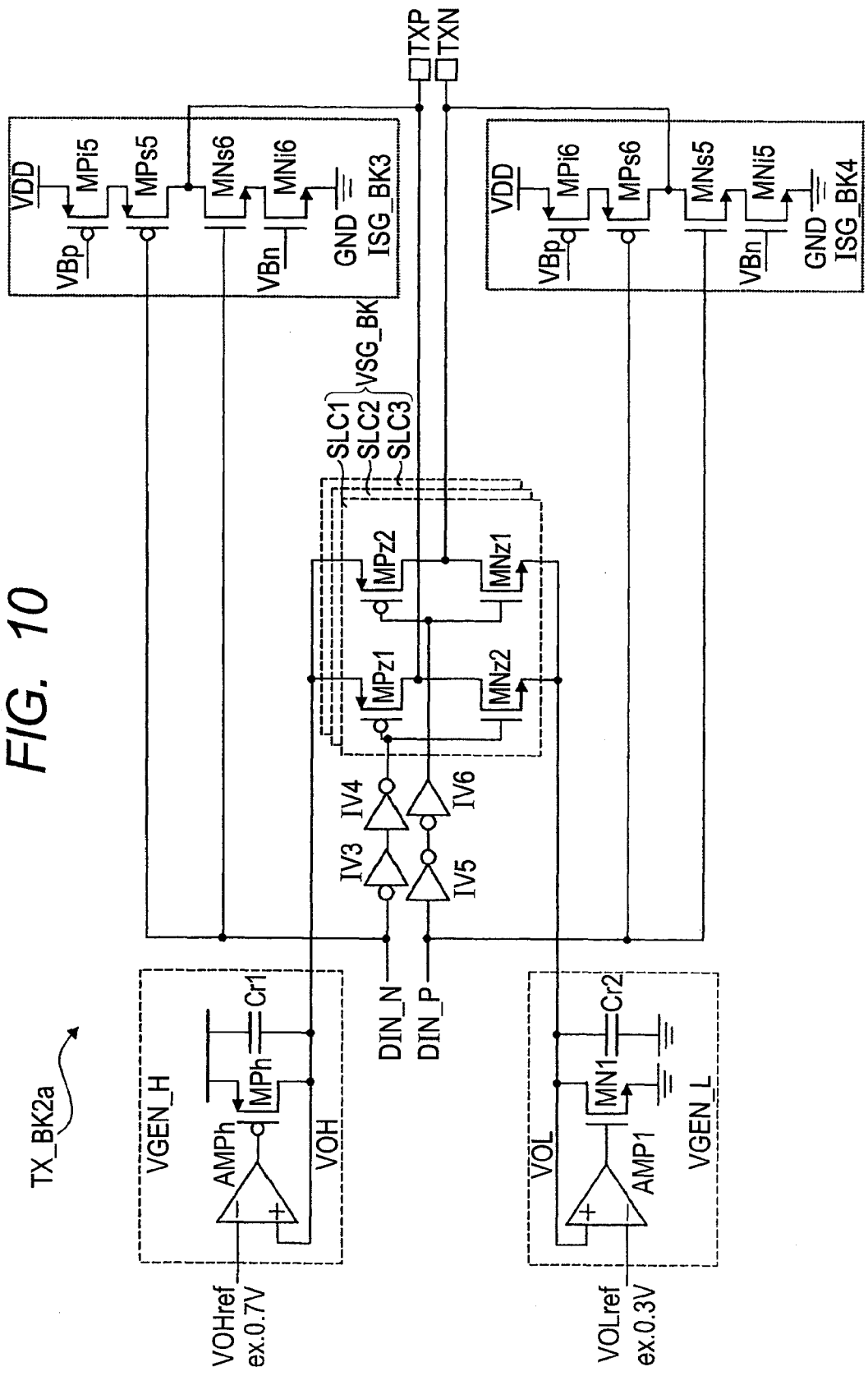
FIG. 10 is a circuit diagram showing an example of a detailed configuration of the output driver circuit of FIG. 8A.

FIG. 10 is a circuit diagram showing an example of a detailed configuration of the output driver circuit of FIG. 8A. An output driver circuit TX_BK2a shown in FIG. 10 is provided with a voltage-signal generation circuit block VSG_BK, current-signal generation circuits block ISG_BK3, ISG_BK4, power supply generation circuits VGEN_H, VGEN_L, and a plurality of inverters IV3 to IV6. More specifically, TX_BK2a, shown in FIG. 10, has a configuration wherein the pulse-signal generation circuits PGEN1a, PGEN 2a, are omitted as compared with the output driver circuit TX_BK1a shown in FIG. 3, and ISG_BK3, ISG_BK4 of FIG. 10 are substituted for the current-signal generation circuit blocks ISG_BK1, ISG_BK2, shown in FIG. 3. Otherwise, FIG. 10 is identical in configuration to FIG. 3, omitting therefore detailed description thereof.

ISG_BK3 is comprised of PMOS transistors MPi5, MPs5, and NMOS transistors MNs6, MNi6. MPi5 has a source connected to the power-supply voltage VDD, and a drain connected to the source of MPs5, while a reference voltage VBp is applied to the gate of MPi5. MPs5 has a drain connected to TXP, and a negative data input signal DIN_N is applied to the gate thereof. Mni6 has a source connected to the grounding power-supply voltage GND, and a drain connected to the source of MPs6 while a reference voltage VBn is applied to the gate of Mni6. MNs6 has a drain connected to TXP and DIN_N is applied to the gate thereof.

MPi5, MPs5, MNs6, and MNi6, in FIG. 10, correspond to IS10, SWp5, SWp6, and IS20, in FIG. 8, respectively.

ISG_BK4 is comprised of PMOS transistors MPi6, MPs6, and NMOS transistors MNs5, MNi5. MPi6 has a source connected to the power-supply voltage VDD, and a drain connected to the source of MPs6, while VBp is applied to the gate of MPi6. MPs6 has a drain connected to TXN, and a positive data input signal DIN_P is applied to the gate of MPs6. Mni5 has a source connected to the grounding power-supply voltage GND, and a drain connected to the source of Mns5 while VBn is applied to the gate of Mni5. MNs5 has a drain connected to TXN, and DIN_P is applied to the gate thereof. MPi6, MPs6, MNs5, and MNi5, in FIG. 10, correspond to IS10, SWp6, SWp5, and IS20, in FIG. 8, respectively.

If such a configuration example as above is adopted, at the time when DIN_N is at the 'L' level (DIN_P is at the 'H' level), MPs5, MNs5 are turned ON, whereupon TXP is charged by current determined by MPi5, and TXN is discharged by current determined by MNi5. Further, at the time when DIN_P is at the 'L' level (DIN_N is at the 'H' level), MPs6, MNs6 are turned ON, whereupon TXN is charged by current determined by MPi6, and TXP is discharged by current determined by MNi6.

Figure 11B:
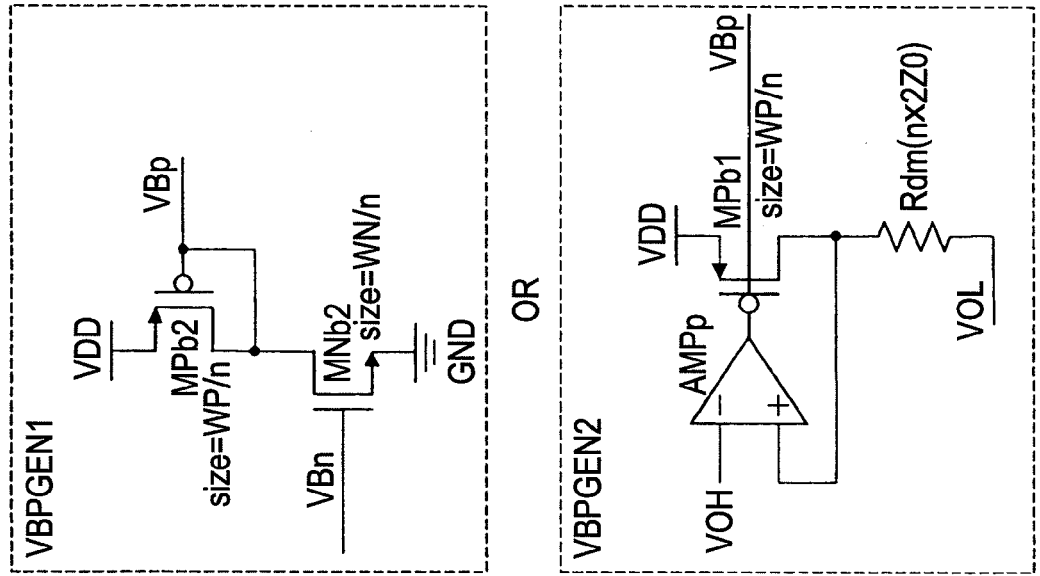
FIGS. 11A, 11B each are a circuit diagram showing a configuration example of a circuit for generating the reference voltages, within the output driver circuit of FIG. 10.
Figure 11A:
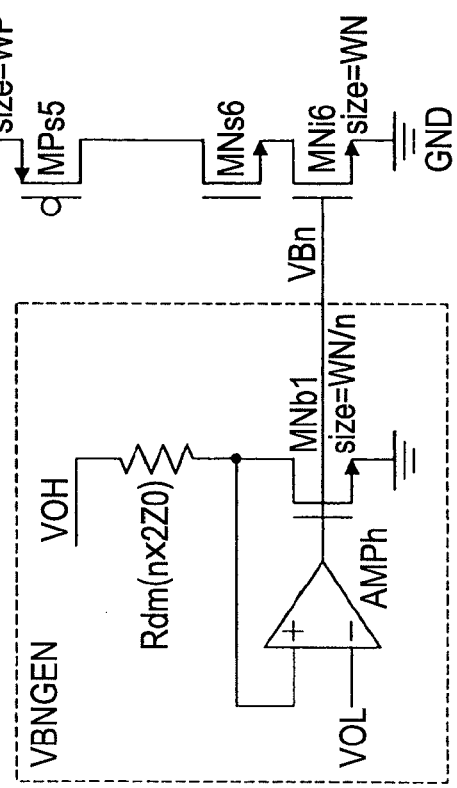

FIGS. 11A, 11B each are a circuit diagram showing a configuration example of a circuit for generating the reference voltages VBn, VBp, within TX_BK2a of FIG. 10. A reference voltage generation circuit VBNGEN shown in FIG. 11A is provided with an amplifier AMPn, an NMOS transistor, and a dummy resistor Rdm. AMPn has a negative input node to which an output power-supply voltage VOL on the low potential side of the block is applied, and an output node connected to the gate of MNb1 while a positive input node of AMPn is connected to the drain of MNb1. MNb1 has a source connected to GND. Rdm has one end connected to the drain of MNb1, and the other end to which an output power-supply voltage VOH on the high potential side of the block is applied. Herein, MNb1 is connected in a current-mirror fashion to Mni6, Mni5, provided in the ISG_BK3, the ISG_BK34, respectively (connected so as to share the gate of each transistor), and a common gate voltage thereof will be the reference voltage VBn.

In FIG. 11A, a resistance value of the dummy resistor Rdm is set to an n-multiple of (2×Z0) as the impedance of the external load resistor. Further, assuming that the Mni6, Mni5 each have a transistor size WN, a transistor size of MNb1 is set to 1/n multiple of WN. Thence, current at (VOH−VOL)/(n×2×Z0) flows to Rdm, and the current is supplied to MNb1, whereupon current corresponding to n-multiple of the current described as above flows to the Mni6, Mni5, respectively, following connection in the current-mirror fashion. As a result, the Mni6, Mni5 will while VDD is outputted from LSp2, and GND is outputted from LSn2, respectively. By so doing, MNis5, and MNis5 will function as a current supply source having a current value I0 at (VOH−VOL)/(2×Z0). Further, if the resistance value of the dummy resistor Rdm is set to an n-multiple of (2×Z0), this will enable magnitude of a penetration current flowing from VOH to be checked, thereby realizing reduction in power consumption.

Meanwhile, the reference voltage VBp is generated by either of two units of reference voltage generation circuits VBPGEN1, VBPGEN2, shown in FIG. 11B. VBPGEN1 is comprised of a PMOS transistor MPb2, and an NMOS transistor MNb2. MPb2 has a source connected to VDD, and both the gate and the drain thereof are connected to a common node. MNb2 has a source connected to GND, and a drain connected to the drain (the gate) of MPb2 while the reference voltage VBn generated in FIG. 11A is applied to the gate of MNb2. Herein, MPb2 is connected in a current-mirror fashion to Mni6, Mni5, provided in the ISG_BK3, the ISG_BK34, respectively (connected so as to share the gate of each transistor), and a common gate voltage thereof will be VBp.

With the configuration example described, a transistor size of MNb2 is set to WN/n, as is the case of, for example, MNb1. Further, assuming that the Mpi5, Mpi6 each have a transistor size WP, a transistor size of MNb2 is set to 1/n multiple of WP. Thence, current at (VOH−VOL)/(n×2×Z0) flows to MNb2, as is the case with MNb1, and the current is supplied to MNb2, whereupon current corresponding to n-multiple of the current described as above flows to the Mpi5, Mpi6, respectively, following connection in the current-mirror fashion. As a result, the Mpi5, Mpi6 will function as the current supply source having a current value I0 at (VOH−VOL)/(2×Z0).

The reference voltage generation circuit VBPGEN2, shown in FIG. 11B, is provided with an amplifier AMPp, a PNMOS transistor MPb1, and a dummy resistor Rdm. AMPp has a negative input node to which the output power-supply voltage VOH on the high potential side of the block is applied, and an output node connected to the gate of MPb1 while the positive input node of AMPp is connected to the drain of MPb1. MPb1 has a source connected to VDD. Rdm has one end connected to the drain of MPb1, and the other end to which the output power-supply voltage VOL on the low potential side of the block is applied. Herein, MPb1 is connected in the current-mirror fashion to the Mpi5, Mpi6, provided in the ISG_BK3, and the ISG_BK34, respectively (that is, connected so as to share the gate of each transistor), and a common gate voltage thereof will be the reference voltage VBp.

With the adoption of this configuration, the Mpi5, Mpi6 will function as the current supply source having the current value I0 at (VOH−VOL)/(2×Z0) owing to the same principle as described in VBNGEN with reference to FIG. 11A.

Figure 12A:
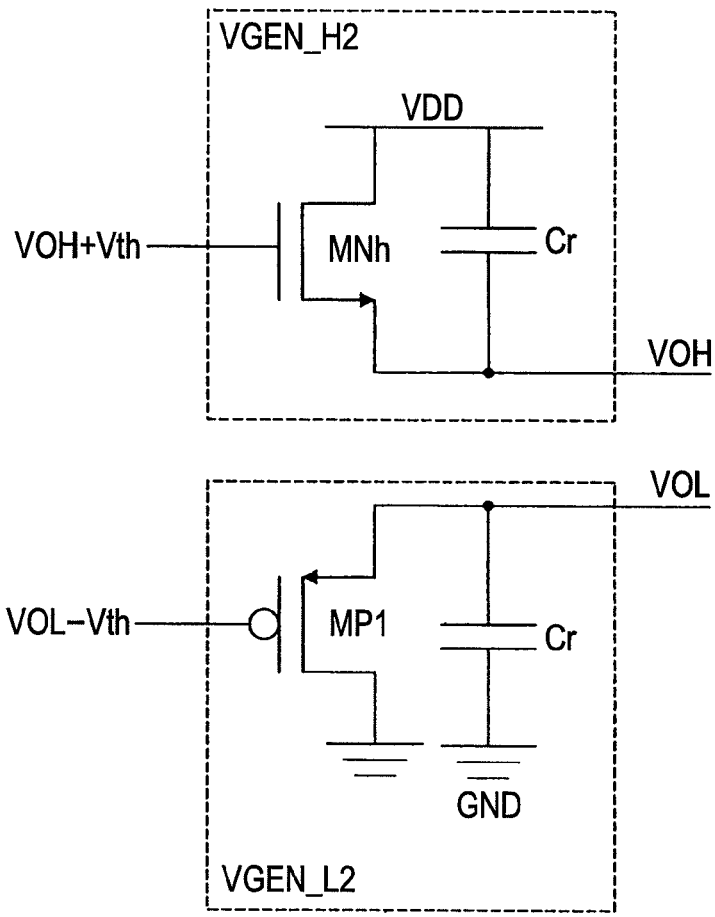
FIG. 12A is a circuit diagram showing a variation of the output driver circuit shown in FIG. 10, FIG. 12B being a circuit diagram showing a comparative example thereof.
Figure 12B:
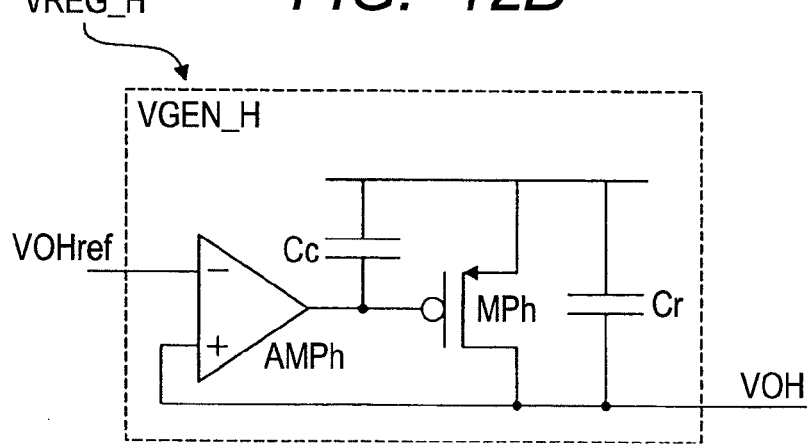

FIG. 12A is a circuit diagram showing a variation of the output driver circuit TX_BK2a shown in FIG. 10, and FIG. 12B is a circuit diagram showing a comparative example thereof. In the output driver circuit TX_BK2a shown in FIG. 10, for example, a power source regulator circuit VREG_H comprising an amplifier AMPh, as shown in FIG. 12B, is used for the power supply generation circuit VGEN_H. Herein, in order to realize impedance matching with the external load resistor (Rld), VOH generated from VGEN_H is preferably designed such that output impedance has no dependency on frequency. Accordingly, stabilization of the output impedance in a low-frequency region is attempted normally by use of a negative feedback loop of AMPh, and stabilization of the output impedance in a high-frequency region is attempted normally by use of a capacitor Cr coupled between the source and the drain of the PMOS transistor MPh. However, because there is the need for adding a capacitor Cc for phase compensation to the gate of MPh, the loop band of MPh cannot be, in practice, expanded. As a result, there will arise, for example, the necessity of increasing the capacitance of the capacitor Cr.

Accordingly, use of a method whereby VOH, and VOL are supplied through a source follower circuit, respectively, as shown in FIG. 12A, will be useful. In FIG. 12A, a power supply generation circuit VGEN_H2 is comprised of an NMOS transistor MNh having a drain connected to VDD, and a gate to which (VOH+Vth) is applied, and a capacitor Cr coupled between the source and the drain of MNh. VOH is outputted from the source of MNh. Further, in FIG. 12A, a power supply generation circuit VGEN_L2 is comprised of a PMOS transistor MP1 having a drain connected to GND, and a gate to which (VOH−Vth) is applied, and a capacitor Cr coupled between the source and the drain of MP1. Then, VOL is outputted from the source of MP1.

Because the source follower circuit is high in frequency responsiveness, it is possible to decrease the capacitance of Cr. Further in the case of the configuration example shown in FIG. 8A, in particular, small current flowing to VOH, VOL, respectively, may be sufficient, as previously described, so that sufficient current can be supplied eve with the use of the source follower circuit. However, there is a concern With a possibility that an output amplitude cannot be increased with the use of the source follower circuit, following a drop in the upper limit of VOH and a rise in the lower limit of VOL, however, in the case of the configuration example shown in FIG. 8A, and so forth, conditions of VOH≦VDD−Vth, and VOL≧Vth are required for IS10, and IS20 each to function as the constant current source in the first place, no particular problem therefore will arise.

Thus, with the use of the output driver circuit according to the third embodiment of the invention, it is possible to typically realize reduction in power consumption in addition to an increase in transmission speed. Further, it is also possible to attain enhancement in transmission waveform quality in addition to the increase in transmission speed.

Fourth Embodiment

With a fourth embodiment of the invention, there is described a variation of the output driver circuit TX_BK2a described in the third embodiment with reference to FIG. 10. FIG. 13 is a circuit diagram showing a configuration example of an output driver circuit according to the fourth embodiment of the invention. An output driver circuit TX_BK2b shown in FIG. 13 corresponds to the output driver circuit TX_BK2 shown in FIG. 8A. The output driver circuit TX_BK2b shown in FIG. 13 has a configuration wherein current-signal generation circuit blocks ISG_BK5, ISG_BK6, shown in FIG. 13, are substituted for the current-signal generation circuit blocks ISG_BK3, ISG_BK4, shown in FIG. 10, respectively, as compared with the TX_BK2a shown in FIG. 10, and further, level-shift circuits LSp1, LSp2, LSn1, and LSn2 are additionally provided. Otherwise, FIG. 13 is identical in configuration to FIG. 10.

LSp1 executes an inversion operation upon receipt of a positive data input signal DIN_P, thereby outputting the power-supply voltage VDD kept at a 'H' level, and the reference voltage VBp kept at a 'L' level. LSp2 executes an inversion operation upon receipt of a negative data input signal DIN_N, thereby outputting the power-supply voltage VDD kept at the 'H' level, and the reference voltage VBp kept at the 'L' level. LSn1 executes an inversion operation upon receipt of DIN_N, thereby outputting the reference voltage VBn kept at an 'H' level, and the grounding power-supply voltage GND kept at an 'L' level. LSn2 executes an inversion operation upon receipt of DIN_P, thereby outputting the reference voltage VBn kept at the 'H' level, and GND kept at the 'L' level. VBp, VBn are generated by the respective circuits described with reference to FIGS. 11A, 11B.

The current-signal generation circuit block ISG_BK5 is comprised of a PMOS transistor MPis5, and an NMOS transistor MNis6. MPis5 has a source connected to VDD, and a drain connected to TXP while the gate of MPis5 is controlled by an output of LSp1. MNis6 has source connected to GND, and a drain connected to TXP while the gate of MNis6 is controlled by an output of LSn2. MPis5 corresponds to IS10, and SWp5, shown in FIG. 8, while MNis6 corresponds to IS20, and SWn6, shown in FIG. 8.

ISG_BK5 is comprised of a PMOS transistor MPis6, and an NMOS transistor MNis5. MPis6 has a source connected to VDD, and a drain connected to TXN while the gate of MPis6 is controlled by an output of LSp2. MNis5 has source connected to GND, and a drain connected to TXN while the gate of MNis5 is controlled by an output of LSn1. Mnis5 corresponds to IS10, and SWp6, shown in FIG. 8, while MNis5 corresponds to IS20, and SWn5, shown in FIG. 8.

In FIG. 13, at the time when DIN_N is at an 'L' level (or DIN_P is at an 'H' level), VBp is outputted from LSp1, and VBn is outputted from LSn1, respectively, while VDD is outputted from LSp2, and GND is outputted from LSn2, respectively. By so doing, MNis5, and MNis5 function as a constant current source having the current value I0, thereby charging TXP while discharging TXN. On the other hand, at the time when DIN_N is at a 'H' level (or DIN_P is at a 'L' level), VBp is outputted from LSp2, and VBn is outputted from LSn2, respectively, while VDD is outputted from LSp2, and GND is outputted from LSn2, respectively, while VDD is outputted from LSp1, and GND is outputted from LSn1, respectively. By so doing, MNis6, and MNis6 function as the constant current source having the current value I0, thereby charging TXN while discharging TXP.

With the adoption of this configuration, since a charging path and a discharging path, inside each of the current-signal generation circuit blocks ISG_BK5, ISG_BK6, can be made up of the MOS transistor in one step, respectively, a higher transmission speed can be realized, as previously described with reference to FIG. 3. However, in this case, the level-shift circuits LSp1, LSp2, LSn1, and LSn2 each need to have a sufficiently high drive capacity.

Thus, with the use of the output driver circuit according to the fourth embodiment of the invention, it is possible to typically realize reduction in power consumption in addition to an increase in transmission speed, as is the case with the third embodiment of the invention. Further, it is also possible to attain enhancement in transmission waveform quality in addition to the increase in transmission speed.

Fifth Embodiment

Figure 14:
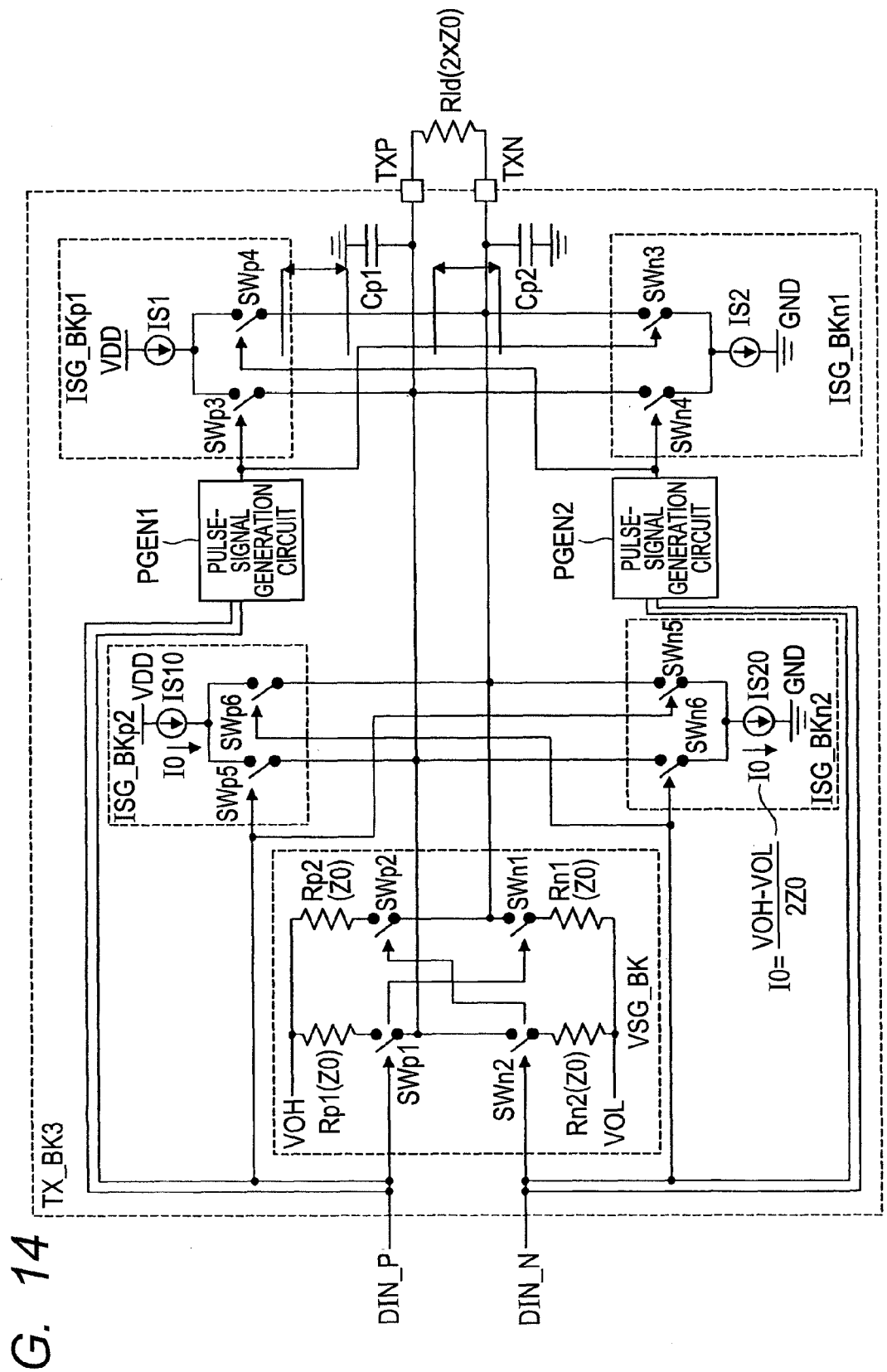
FIG. 14 is a schematic representation showing a configuration example of an output driver circuit according to a fifth embodiment of the invention.
Figure 15A:
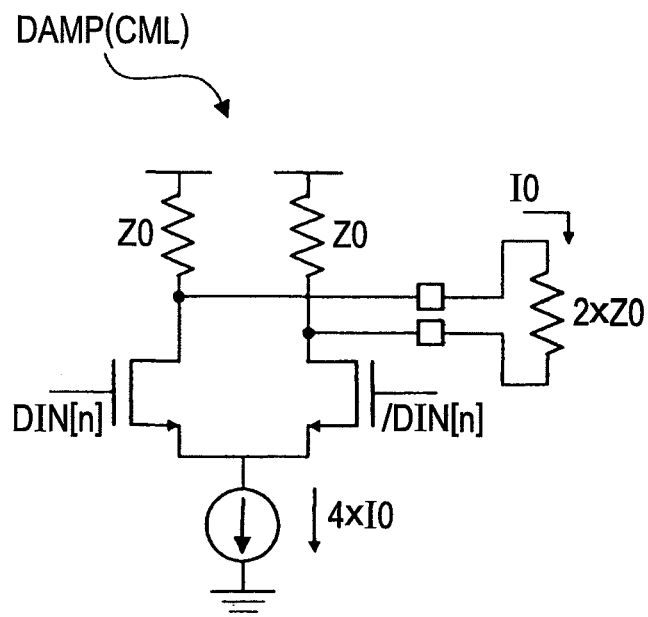
FIGS. 15A, 15B each are a circuit diagram showing a configuration example of an output driver circuit studied as a prerequisite for the invention.
Figure 15B:
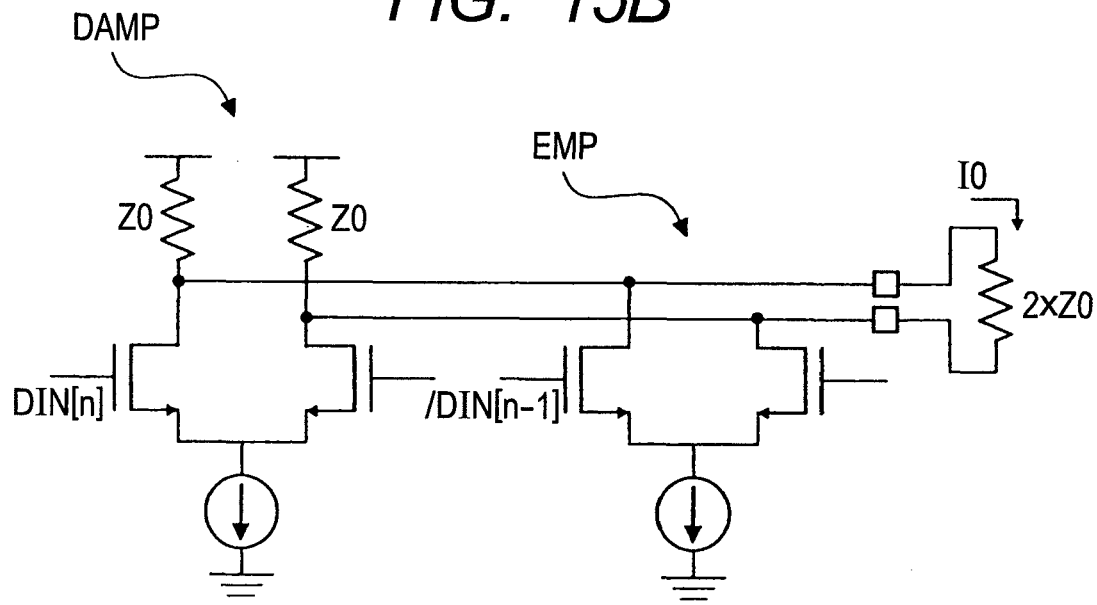

With a fifth embodiment of the invention, there is described a configuration example that offer an excellent compromise between the configuration example of the output driver circuit according to the first embodiment of the invention, described with reference to FIG. 2A, and the configuration example of the output driver circuit according to the third embodiment of the invention, described with reference to FIG. 8A. FIG. 14 is a schematic representation showing a configuration example of an output driver circuit according to the fifth embodiment of the invention. An output driver circuit TX_BK3 shown in FIG. 14 has a configuration wherein there are provided the voltage signal generation circuit block VSG_BK, the pulse-signal generation circuits PGEN1, PGEN 2, and the current-signal generation circuit blocks ISG_BKp1, ISG_BKn1, described with reference to FIG. 2A, together with the current-signal generation circuit blocks ISG_BKp2, ISG_BKn2, described with reference to FIG. 8A.

In the case of the configuration described as above, at the time when the positive data input signal DIN_P, and the negative data input signal DIN_N each have made a transition, the pulse signal is generated from the pulse-signal generation circuits PGEN1, PGEN2, respectively, whereupon the respective current-driving of TXP, TXN are executed by IS1, IS2, respectively, for the duration of the pulse signal being in the activated state, as described with reference to FIG. 2A. Further, in parallel therewith, the respective current-driving of TXP, TXN are executed by IS10, IS20, respectively, as described with reference to FIG. 8A, and the respective voltage-driving of TXP, TXN are executed by VSG_BK. For the duration of data transition, pre-emphasis is carried out by adding the respective current-driving executed by IS1, IS2 to the respective current-driving executed mainly by IS10, IS20, and during this period, VSG_BK functions only as the circuit for impedance matching.

Thereafter, upon the pulse signals from PGEN1, PGEN2, respectively, being turned into the deactivated state, the data output signals from TXP, TXN, respectively, undergo a shift toward the stationary state. In this case, the current-driving of TXP, TXN, respectively, are executed by IS10, IS20, respectively, as described with reference to FIG. 8A, and the voltage-driving of TXP, and TXN, respectively, are executed by VSG_BK. In this period of the stationary state, output amplitudes at TXP, and TXN, respectively, are set mainly by the respective current-driving executed by IS10, IS20, while VSG_BK functions only as the circuit for impedance matching.

Thus, with the use of the output driver circuit according to the fifth embodiment of the invention, it is possible to typically obtain various advantageous effects described in the first embodiment of the invention, in synergy with various advantageous effects described in the third embodiment of the invention, so that reduction in power consumption can be realized in addition to further increase in transmission speed. Further, it is also possible to attain further enhancement in transmission waveform quality in addition to the further increase in the transmission speed. Further, to be more specific, TX_BK3 shown in FIG. 14 can be implemented by properly combining various circuits described with reference to FIGS. 3, 6, 10, 13, and so forth, with each other.

As described in the foregoing, the invention developed by the present inventor has been described on the basis of the preferred embodiments of the invention, however, it is to be understood that the invention be not limited thereto, and that various changes and modifications may be made in the invention without departing from the spirit and scope thereof.

The output driver circuit according to any of the embodiments of the invention will be beneficial if it is used as a driver for driving a laser diode of an optical communication system. In addition, the same can be widely used as a differential output driver for use in high-speed communications.

What is claimed is:

1. An output driver circuit comprising:
a first circuit that controls ON/OFF between a positive differential output node and a first power source;
a second circuit that controls ON/OFF between a negative differential output node and a second power source lower in voltage than the first power source;
a third circuit that controls ON/OFF between the negative differential output node and the first power source;
a fourth circuit that controls ON/OFF between the positive differential output node and the second power source;
a first pulse generation circuit that generates a first pulse-signal at a time when a differential input node has made a transition from a first logical level to a second logical level;
a second pulse generation circuit that generates a second pulse-signal at a time when the differential input node has made a transition from the second logical level to the first logical level;
a first current circuit that causes a charging current to flow to the positive differential output node;
a second current circuit that causes a discharging current to flow to the negative differential output node;
a third current circuit that causes a charging current to flow to the negative differential output node;
a fourth current circuit that causes a discharging current to flow to the positive differential output node,
wherein the first circuit and the second circuit each are controlled so as to be in the ON state and to have a first impedance at a time when the differential input node is at the second logical level while the first circuit and the second circuit each are controlled so as to be in the OFF state at a time when the differential input node is at the first logical level,
wherein the third circuit and the fourth circuit each are controlled so as to be in the ON state and to have the first impedance at the time when the differential input node is at the first logical level while the third circuit and the fourth circuit each are controlled so as to be in the OFF state at the time when the differential input node is at the second logical level,
wherein the first current circuit and the second current circuit each cause current to flow for a period of a pulse width of the first pulse-signal,
wherein the third current circuit and the fourth current circuit each cause current to flow for a period of a pulse width of the second pulse-signal, and
wherein the pulse width of the first pulse-signal and the pulse width of the second pulse-signal are each controlled so as to be variable according to setting.

2. The output driver circuit according to claim 1,
wherein the first pulse-signal includes third and fourth pulse-signals,
wherein the second pulse-signal includes fifth and sixth signals,
wherein the first current circuit causes the charging current to flow for a period of a pulse width of the third pulse-signal,
wherein the second current circuit causes the discharging current to flow for a period of a pulse width of the fourth pulse-signal,
wherein the third current circuit causes the charging current to flow for period of a pulse width of the fifth pulse-signal,
wherein the fourth current circuit causes the discharging current to flow for period of a pulse width of the sixth pulse-signal,
wherein the pulse width of the third pulse-signal is decided according to a set delay amount of a first variable delay circuit,
wherein the pulse width of the fourth pulse-signal is decided according to a set delay amount of a second variable delay circuit,
wherein the pulse width of the fifth pulse-signal is decided according to a set delay amount of a third variable delay circuit, and
wherein the pulse width of the sixth pulse-signal is decided according to a set delay amount of a fourth variable delay circuit.

* * * * *